US008674999B2

(12) United States Patent
Hein

(10) Patent No.: US 8,674,999 B2
(45) Date of Patent: *Mar. 18, 2014

(54) CIRCUIT

(75) Inventor: Thomas Hein, Munich (DE)

(73) Assignee: Qimonda AG, Munich (DE)

( * ) Notice: Subject to any disclaimer, the term of this patent is extended or adjusted under 35 U.S.C. 154(b) by 164 days.

This patent is subject to a terminal disclaimer.

(21) Appl. No.: 13/443,011

(22) Filed: Apr. 10, 2012

(65) Prior Publication Data

US 2012/0198265 A1    Aug. 2, 2012

Related U.S. Application Data

(63) Continuation of application No. 11/726,401, filed on Mar. 21, 2007, now Pat. No. 8,207,976.

(30) Foreign Application Priority Data

Mar. 15, 2007 (EP) ..................................... 07005409

(51) Int. Cl.
  *G06F 13/14*  (2006.01)
(52) U.S. Cl.
  USPC ......................................................... 345/519
(58) Field of Classification Search
  USPC ................ 345/519; 365/194, 233.1; 327/158; 714/798; 713/400, 401, 500, 503; 711/167; 375/354

See application file for complete search history.

(56) References Cited

U.S. PATENT DOCUMENTS

| 6,029,250 | A  | * | 2/2000 | Keeth ............................. 713/400 |
| 6,925,011 | B2 | * | 8/2005 | Pekny et al. .............. 365/185.28 |
| 7,095,789 | B2 | * | 8/2006 | Ware et al. ..................... 375/257 |
| 7,477,257 | B2 | * | 1/2009 | Greco et al. ................... 345/531 |

* cited by examiner

*Primary Examiner* — Hau Nguyen
(74) *Attorney, Agent, or Firm* — John S. Economou

(57) ABSTRACT

An embodiment of a circuit comprises an output buffer, a data interface which is at least in a position to transmit data, the data interface being coupled to an output of the output buffer, a command/address interface coupled to an input of the output buffer, a memory core coupled to the input of the output buffer, and a controller circuit configured to cause data stored within the output buffer to be output to the data interface, further configured to cause data stored within the memory core to be output to the input of the output buffer, so that the data is stored within the output buffer, and further configured to cause provision of data received at the command/address interface to the input of the output buffer, so that the data is stored within the output buffer.

17 Claims, 9 Drawing Sheets

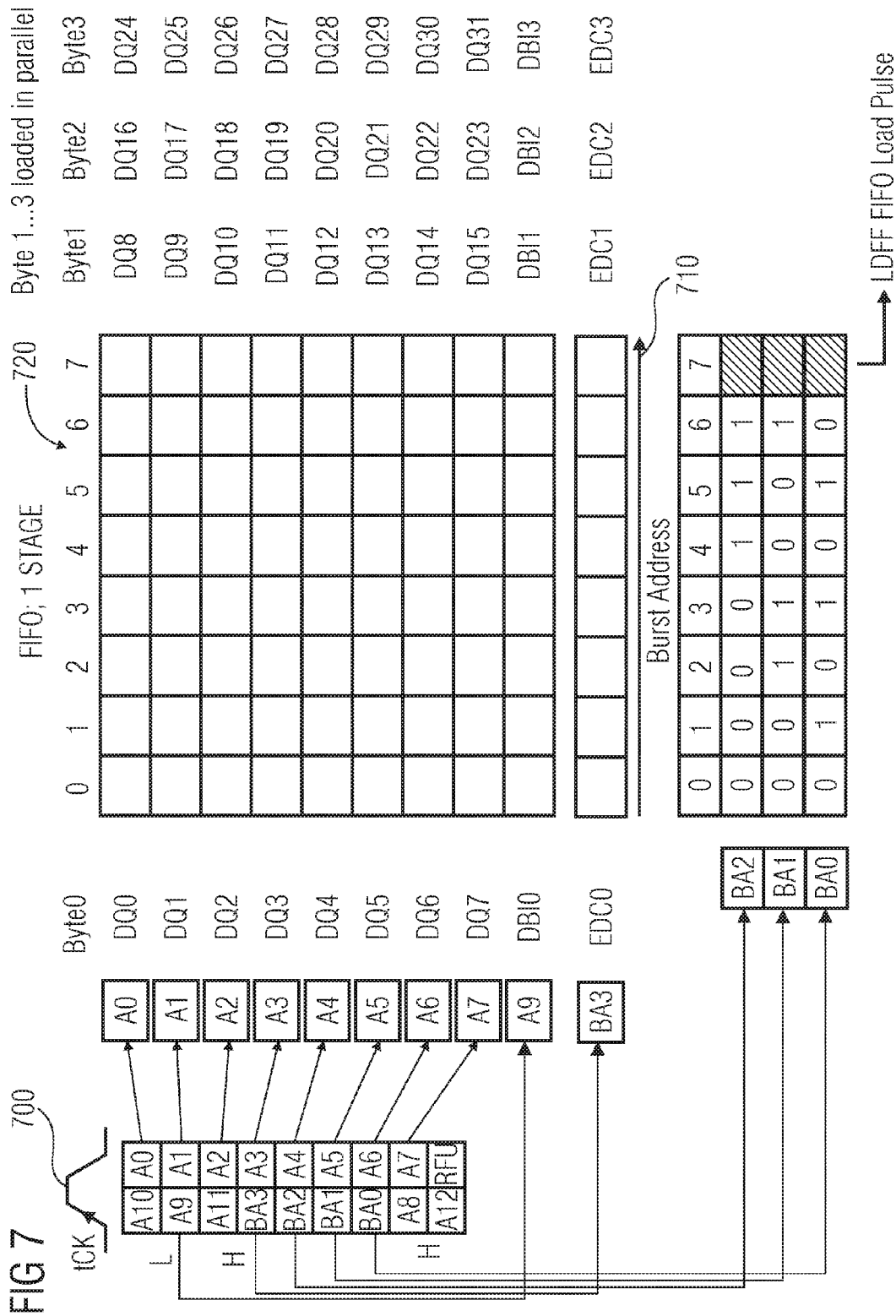

CIRCUIT

CROSS REFERENCE TO RELATED APPLICATIONS

This application is a continuation of U.S. application Ser. No. 11/726,401, filed Mar. 21, 2007, which is incorporated by reference in its entirety.

BACKGROUND

The invention relates to a circuit and/or a controller and/or a system comprising at least one circuit and at least one controller. Examples of a circuit, a controller, or a system may thus be derived from the field of memories.

SUMMARY

One embodiment of a circuit comprises an output buffer comprising an input and an output, a data interface which is at least in a position to transmit data, the data interface being coupled to the output of the output buffer, a command/address interface coupled to the input of the output buffer, a memory core coupled to the input of the output buffer, and a controller circuit configured to cause data stored within the output buffer to be output to the data interface upon reception of a first signal. The controller circuit is further configured to cause data stored within the memory core to be output to the input of the output buffer upon reception of a second signal, so that the data is stored within the output buffer, and further configured to cause provision of data received at the command/address interface to the input of the output buffer upon reception of third signal, so that the data is stored within the output buffer.

One embodiment of a controller comprises a command/address interface, a data interface, and a synchronization circuit coupled to the command/address interface and to the data interface, and configured to output a transmit data pattern on the command/address interface, further configured to receive a receive data pattern from the data interface, and further configured to synchronize the data interface to a clock on the basis of the transmit data pattern and the receive data pattern.

BRIEF DESCRIPTION OF THE FIGURES

Embodiments of the present invention will be described with reference to the subsequent drawings, wherein:

FIG. 7 schematically illustrates data transmission within the framework of the embodiment shown in FIG. 6.

DETAILED DESCRIPTION OF THE EMBODIMENTS

Figure 4:
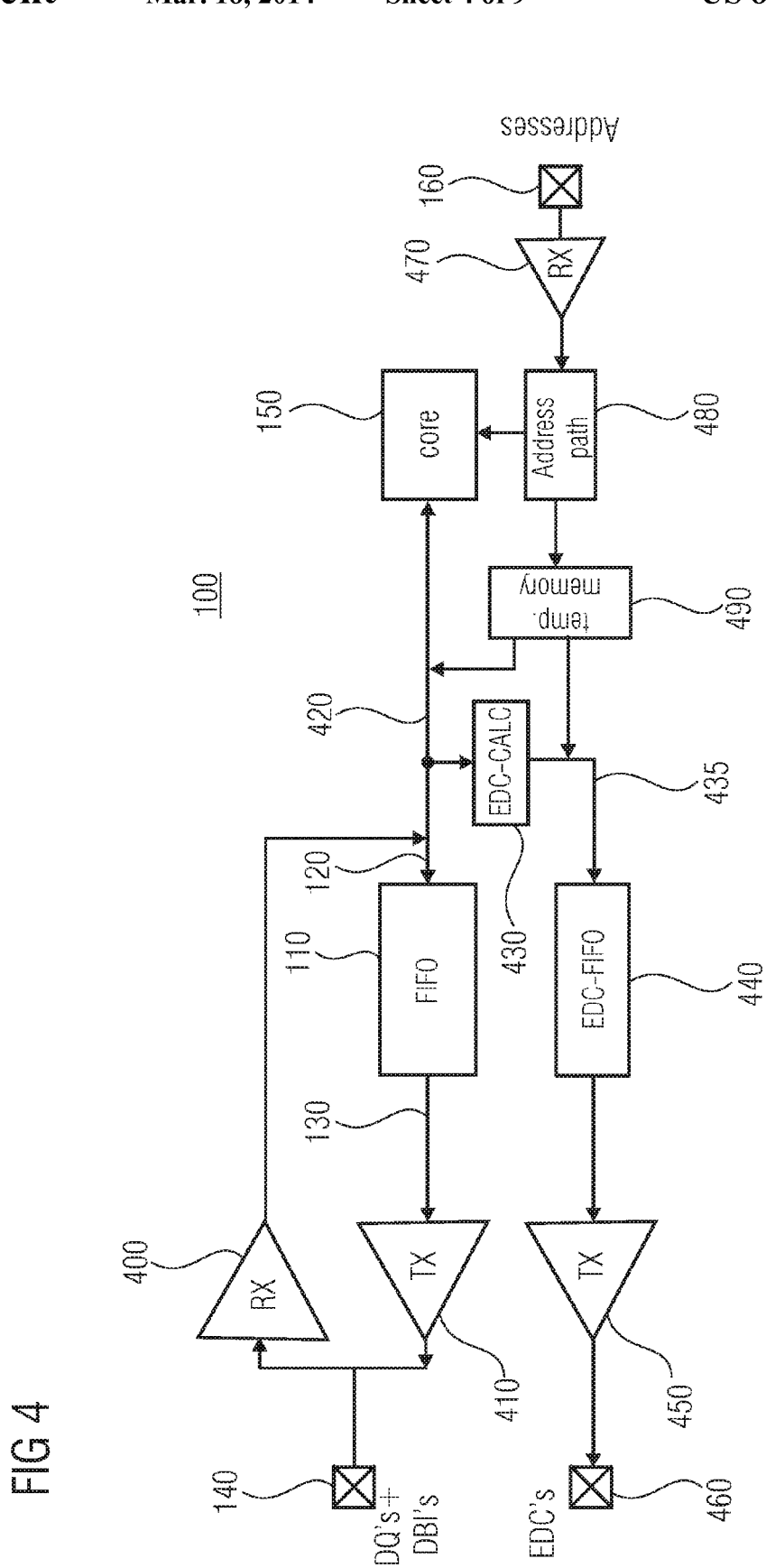
FIG. 4 shows a block diagram of an embodiment of a circuit as a memory circuit.
Figure 5:
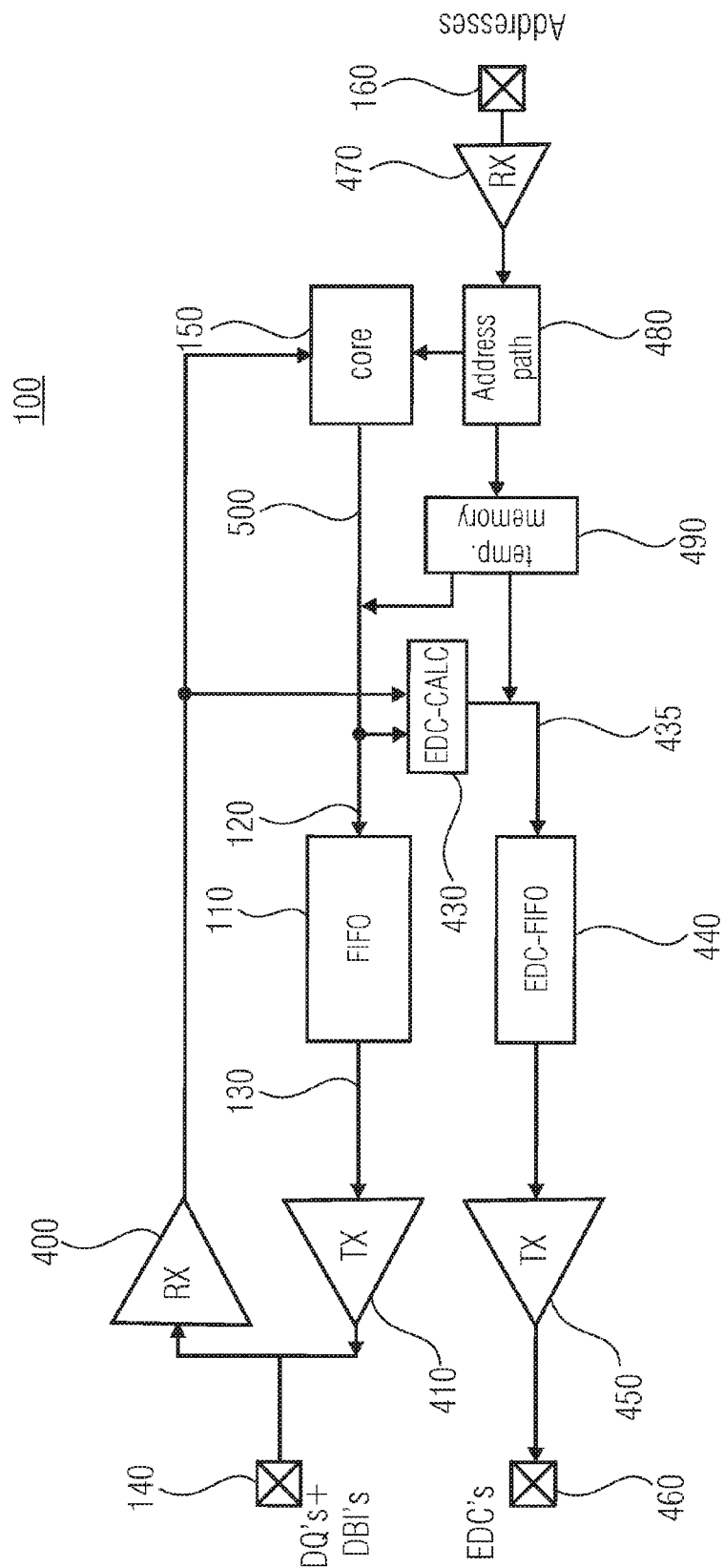
FIG. 5 shows a block diagram of a further embodiment of a circuit as a memory circuit.
Figure 6A:
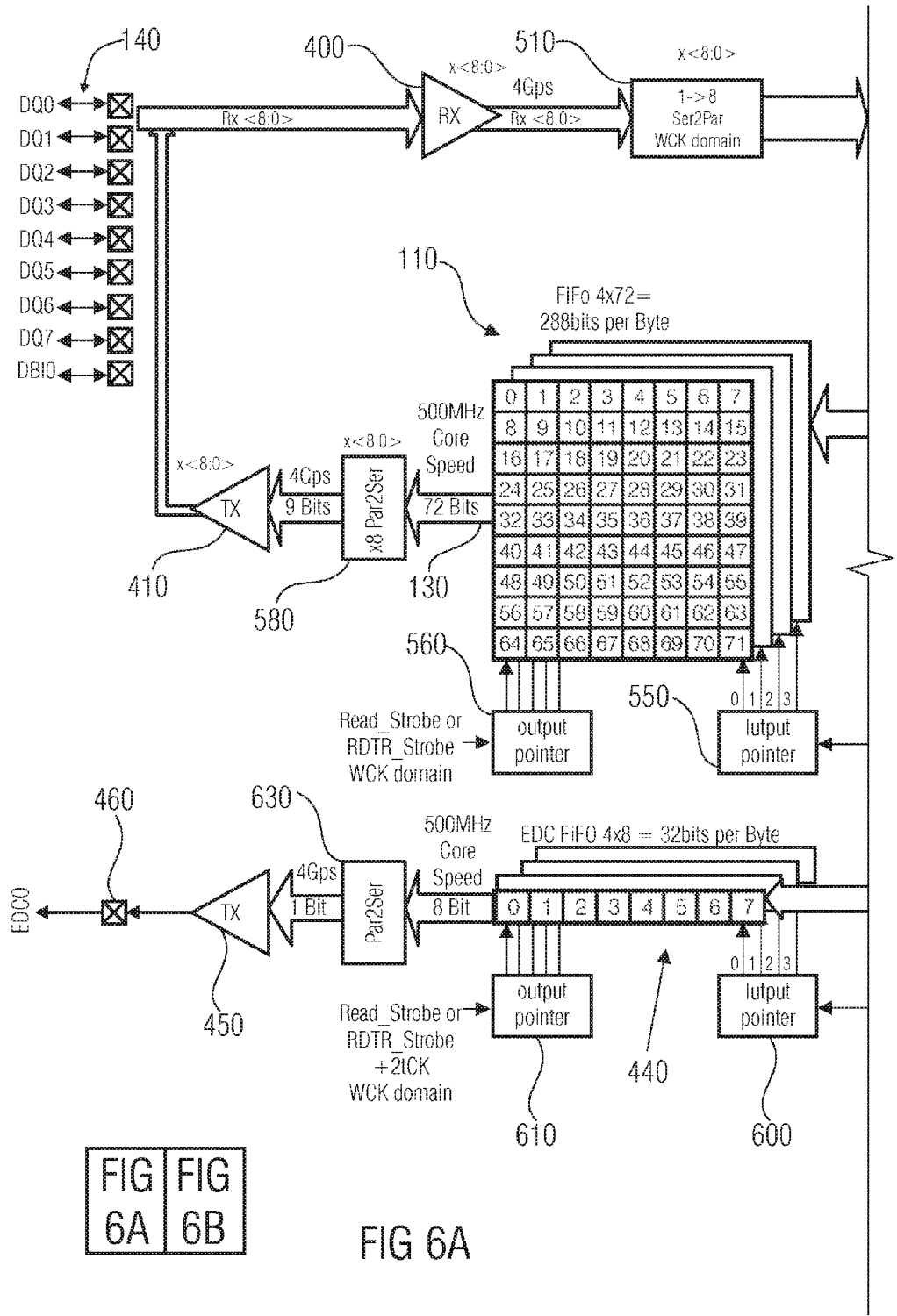
FIG. 6 shows a block diagram of a further embodiment of a circuit as a memory circuit.
Figure 6B:
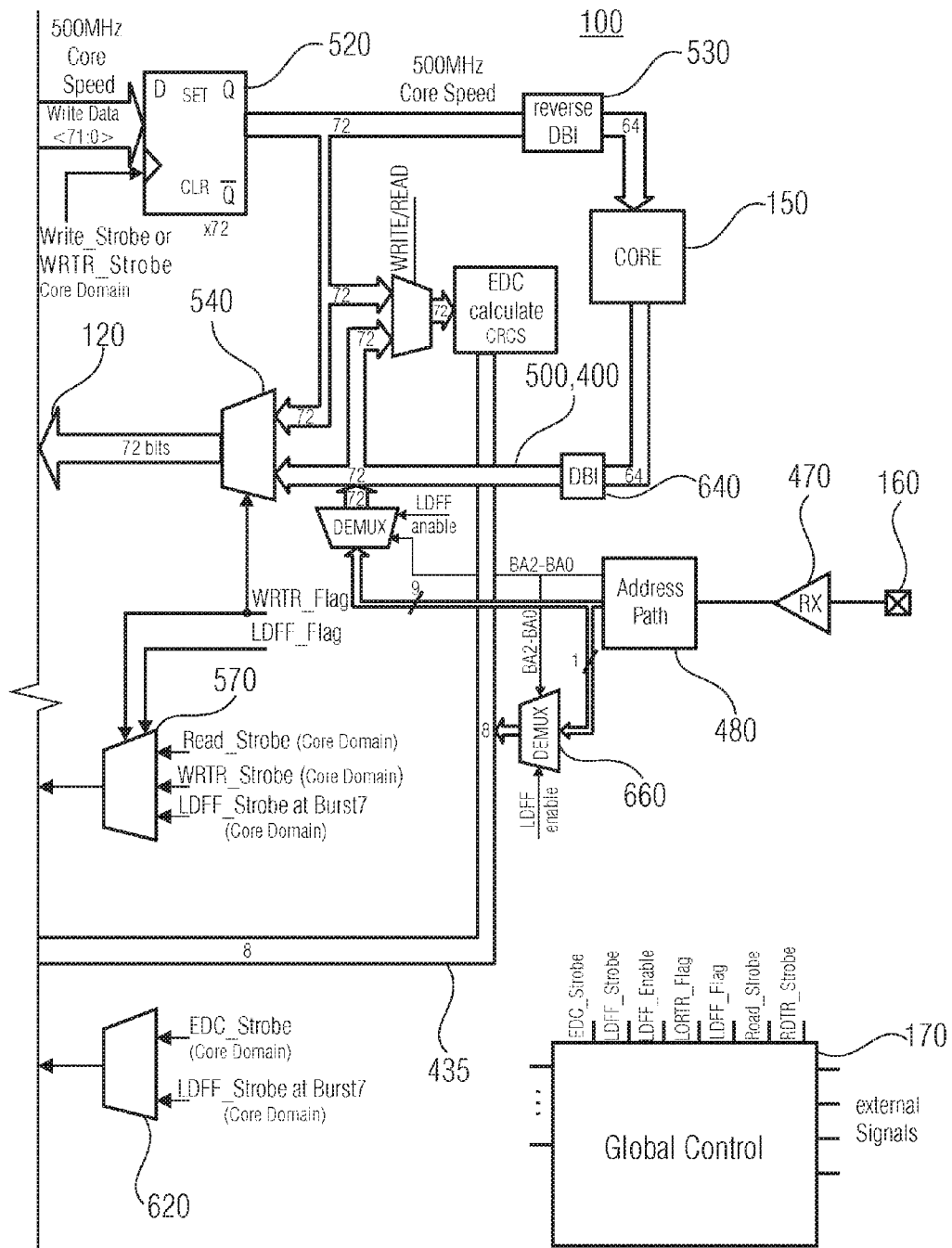
Figure 8:
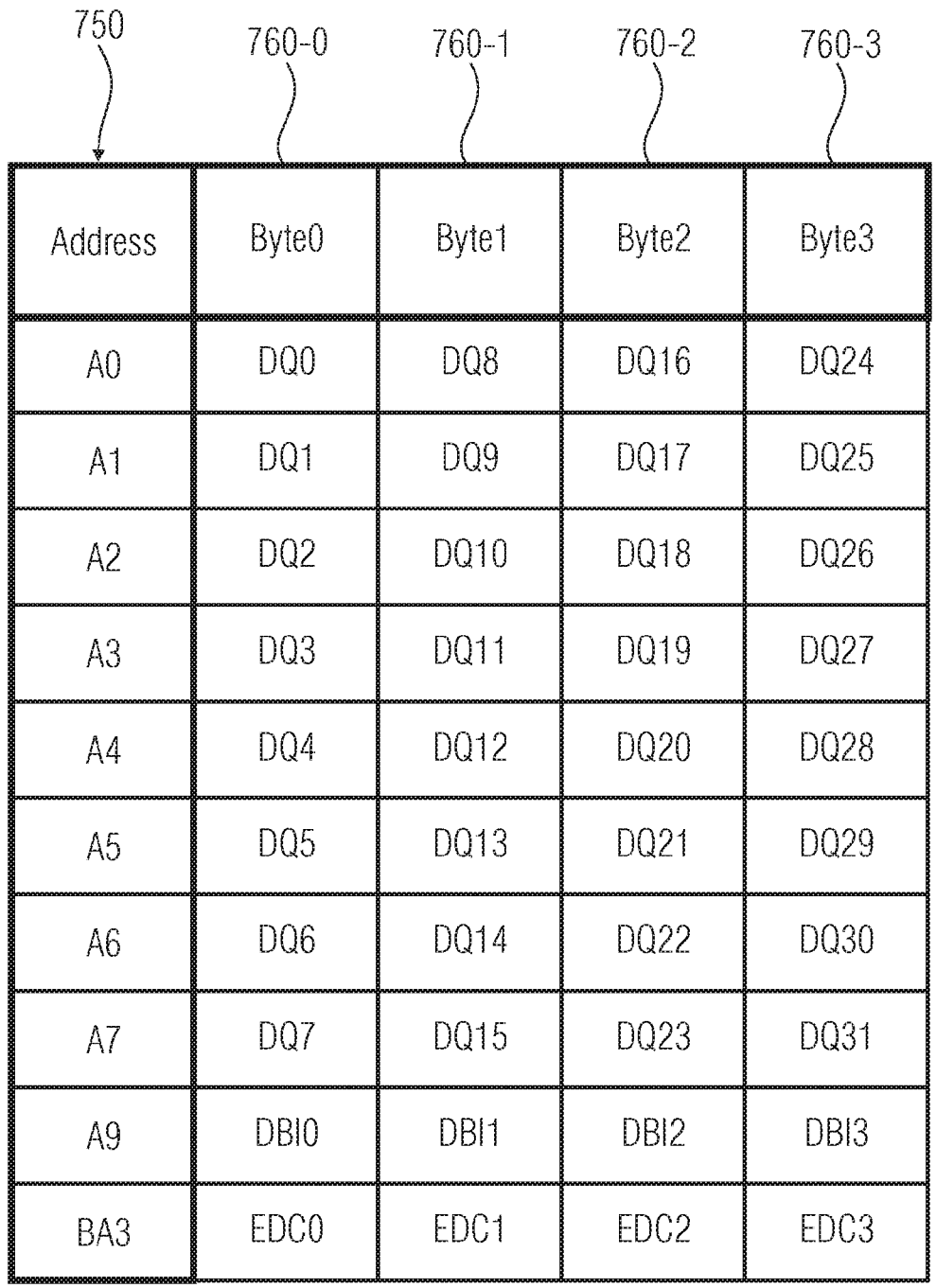
FIG. 8 schematically illustrates an association of address lines of the command/address interface, and of data lines of the data interface, within the framework of the embodiment depicted in FIG. 6.

FIGS. 1 to 8 shows block diagrams of various embodiments of circuits, of a controller and of a memory system, as well as an illustration of a possible data transmission within the framework of the embodiment, shown in FIG. 6, of a memory circuit with regard to FIG. 7, and an association table in FIG. 8 for the embodiment shown in FIG. 6. Embodiments of such circuits, controllers and systems comprised of at least one circuit and at least one controller, as are taken from the field of memory technology, for example, shall be described and discussed in the further course of the present patent application. In other words, in particular, embodiments of circuits will be described and discussed in the form of embodiments of memory circuits, embodiments of controllers will be described and discussed in the form of memory controllers, and embodiments of systems will be described and discussed in the form of embodiments of memory systems, such as a graphics memory system or graphics system.

Embodiments of circuits, controllers and systems in this context may be implemented, for example, in the form of discrete circuits consisting of individual switching elements, switching groups or subcircuits. In addition, they may also be configured or implemented in the form of integrated circuits (ICs) or in the form of application-specific integrated circuits (ASICs). Of course, hybrid forms of discrete and integrated circuits may also be used or implemented in one implementation of an embodiment of a circuit, or memory circuit, of one embodiment of a controller, or memory controller, or of one embodiment of a system, or memory system, or graphics system. Thus, for example, embodiments of systems may be realized within the context of one single integrated circuit, as a system of two or more integrated circuits, or as a system of discrete circuit elements such as resistors, transistors and other electric and/or electronic devices.

Before further embodiments of the present invention are described with reference to FIGS. 2 to 8, a first embodiment of a memory circuit will initially be illustrated with reference to the block diagram depicted in FIG. 1.

Figure 1:
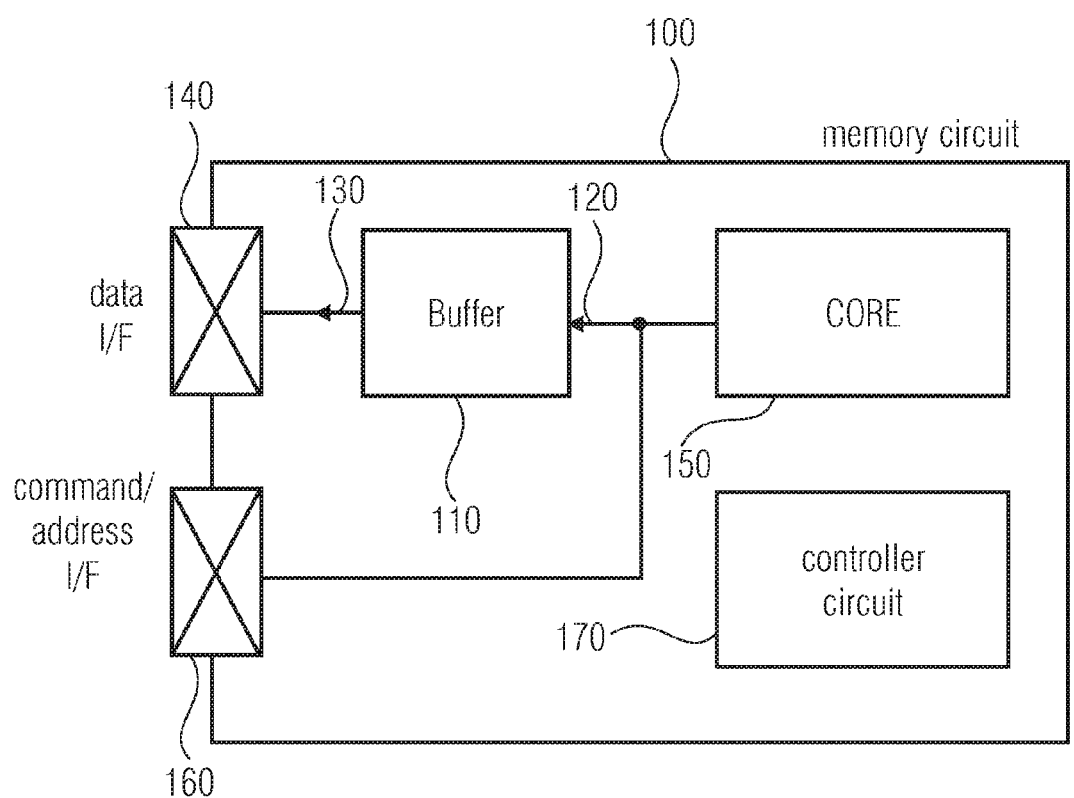
FIG. 1 shows a block diagram of an embodiment of a circuit.

FIG. 1 shows a first embodiment of a memory circuit 100 comprising an output buffer 110 or buffer 110 which has an input 120 and an output 130. In this context, buffer 110 is coupled, with its output 130, to a data interface, or data I/F, 140, which is at least in a position to transmit data via the data interface 140. In this context, interfaces are abbreviated by "I/F" in the figures within the context of the present application. In addition, memory circuit 100 comprises a memory core, or core, 150 coupled to input 120 of output buffer 110. In this context, FIG. 1 indicates the signal flow direction through output buffer 110 by means of two arrows in the area of input 120 and output 130, it being possible for the signals to pass into input 120 of output buffer 110 as they follow the signal flow direction, and to be provided again at output 130 thereof by output buffer 110. This may be initialized, or effected, for example, upon a first signal. Such a first signal may occur, for example, in the form of a command.

In addition, input 120 of buffer 110 is coupled to a command/address interface, or command/address I/F, 160. In addition, memory circuit 100 comprises a controller circuit 170 coupled to the various components of memory circuit 100 in FIG. 1, which is not depicted in FIG. 1 for clarity's sake.

For example, controller circuit 170 is configured such that it may cause output buffer 110 to output data stored therein to data interface 140, so that it may be forwarded, via data interface 140, to components located outside of memory circuit 100. This may be caused by the controller circuit 170, which is also referred to as global control and which may receive signals, data and information from a memory controller which is located externally in relation to memory circuit 100, for example on the basis of the first signal already mentioned above.

Controller circuit 170 of the embodiment of a memory circuit 100 as is depicted in FIG. 1 is moreover configured to be able to cause data stored within memory core 150 to be forwarded to output buffer 110, for example upon a second signal, so that output buffer 120 buffers, or latches, the data in question. Also, controller circuit 170 is further configured, in the embodiment shown in FIG. 1, to forward data which is received at command/address interface 160 of memory circuit 100 to output buffer 110, or to input 120 of output buffer 110, upon receiving a third signal, such that said output buffer 110 also buffers, or latches, the data in question from command/address interface 160. The second and third signals may also be implemented in the form of commands, for example.

Of course, in the embodiment depicted in FIG. 1 of a memory circuit 100 the individual components, for example output buffer 110, memory core 150 and the two interfaces 140, 160 may optionally be configured such that they are coupled to one another via unidirectional buses or via directional buses or bus systems. Even if the signals thus flow in only one direction in the above-described manner, it is possible, in principle, to transfer, or transport, even the signal flow from data interface 140 to memory core 150, as the case may be, using bypass line systems, or bypass bus systems not shown in FIG. 1. These optional structures are not shown in FIG. 1 for clarity's sake.

It shall be noted in this context that within the framework of the present patent application, components, objects and structures are coupled to one another in that they are directly interconnected (in an electrically conductive manner) or are interconnected via further components. In other words, within the framework of the present patent application, coupled components, structures and objects are understood to mean such components, structures and objects which are interconnected both indirectly and directly by using electrically conductive connections. For example, two components may be (indirectly) coupled to one another via a driver circuit, a buffer, a resistor, a bus structure, a signal line, or another component.

Thus, embodiments of memory circuits 100 as are shown, for example, in FIG. 1, enable to transfer data to output buffer 110 while bypassing data interface 140 without altering or manipulating the data stored within memory core 150. Embodiments may thus allow to transfer data to output buffer 110, for example, without any additional registers which again would occupy space on the chip of memory circuit 100. Thus, some embodiments of an appropriate memory circuit 100 allow, for example, to transfer complex data patterns into memory circuit 100 without them having to pass data interface 140. To this end, a memory circuit 100 may receive the data in question via command/address interface 160, and transfer it to output buffer 110 utilizing global control, or controller circuit, 170. Thus, an embodiment of a memory circuit 100, as is shown, e.g., in FIG. 1, allows calibration, adjustment, or re-calibration data interface 140 on the part of a memory controller, not shown in FIG. 1, without it being necessary for the data interface 140—which previously may be unconditioned, unadjusted, or uncalibrated, as the situation may be—having to be used already for receiving the data.

Embodiments of a memory circuit 100 as are shown, for example, in FIG. 1, may thus allow a more reliable, more flexible or faster calibration or re-calibration of interface parameters by transferring data which, in principle, are settable at will to output buffer 110 while bypassing the interface in question. An embodiment of a memory circuit 100 may allow this, for example, in cooperation with a memory controller, which allows the interface parameters to be set, i.e. to be set, for example, with regard to the timing, or to the synchronization of the respective data interface 140. One embodiment of an appropriate memory circuit will now be explained in conjunction with FIG. 2 and the block diagram depicted there.

Figure 2:
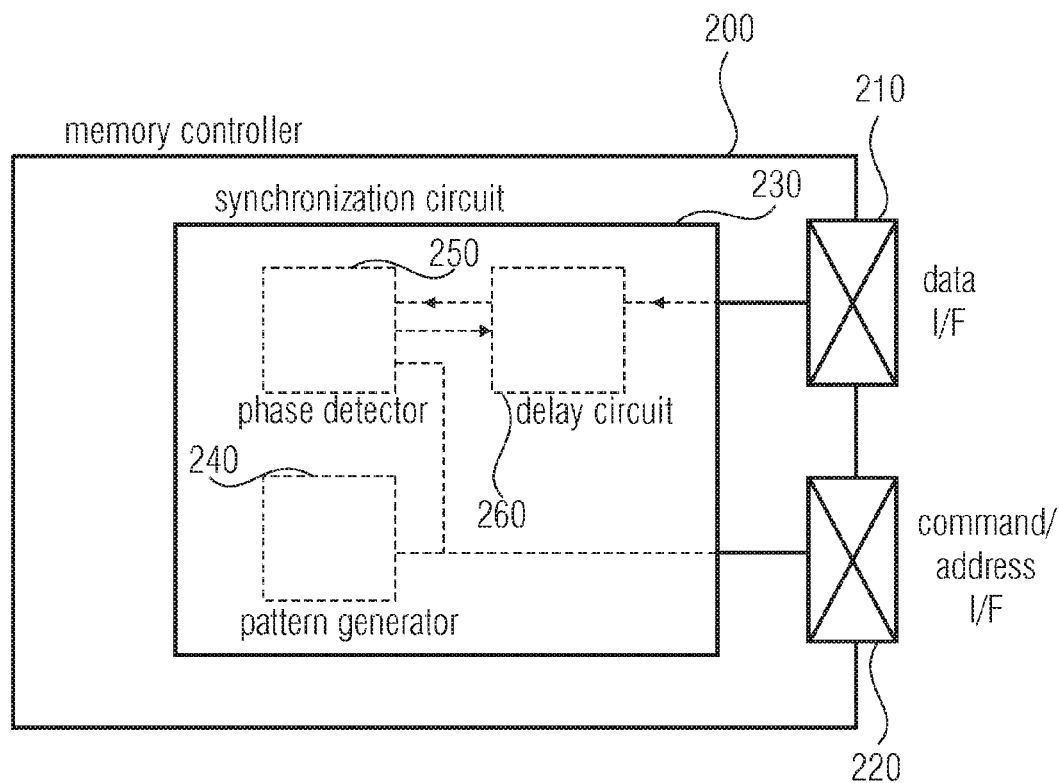
FIG. 2 shows a block diagram of an embodiment of a controller.

FIG. 2 shows an embodiment of a memory controller 200 comprising a data interface, or data I/F, 210 and a command/address interface, or command/address I/F, 220. In addition, an embodiment of a memory controller 200 comprises a synchronization circuit 230 coupled both to command/address interface 220 and to data interface 210. Synchronization circuit 230 here typically is configured such that it may output a transmit data stream, or a transmit data pattern, at or via command/address interface 210. In addition, the synchronization circuit is configured to receive a receive data stream, or a receive data pattern, from data interface 210. On the basis of these two data patterns, i.e. on the basis of the transmit data pattern and the receive data pattern, synchronization circuit 230 is then in a position to synchronize data interface 210 in relation to a clock, or a clock signal. The clock signal or the clock may be generated both internally and externally. Thus, there is a possibility, depending on the embodiment or implementation, of generating, or providing, an internal clock signal on the basis of an external clock signal. This may be effected, for example, via a phase-locked loop circuit (PLL circuit), not shown in FIG. 2. Of course, the internal and external signals may have different frequencies. For example, depending on the embodiment, the frequency of the internal clock signal may be, for example, an integer multiple of the external frequency. Naturally, however, other mutual ratios of the frequencies may be possible. Thus, the two frequencies may also match each other.

For the purpose of synchronizing data interface 210, in embodiments of a memory controller 200, synchronization circuit 230 may comprise, for example, a pattern generator or signal generator 240 which creates the transmit data pattern, for example on the basis of pre-defined data patterns which have been randomly generated or algorithmically calculated, and forwards them to command/address interface 220. In the case of such an embodiment, this transmit data pattern may be forwarded, for example, to a phase detector 250 coupled to data interface 210 via a delay circuit 260. Since the internal configuration of synchronization circuit 230 is only one possible embodiment, the components in question (pattern generator 240, phase detector 250 and delay circuit 260) are depicted in phantom as optional elements. Other embodiments of synchronization circuit 230 may comprise further or completely different components.

An embodiment of a memory controller 200 as is shown, for example, in FIG. 2 thus allows to output, via pattern generator 240, a data pattern as a transmit data pattern via command/address interface 220 and to provide this pattern to phase detector 250 at the same time. If a receive data pattern arrives, for example on the basis of the transmit data pattern, via data interface 210, it will pass delay circuit 260, as is indicated by the arrows in FIG. 2, and will possibly be forwarded to phase detector 250 in a delayed manner. Phase detector 250 is now in a position, or is configured accordingly, to decide, on the basis of a comparison of the transmit data pattern and the receive data pattern, whether the receive data pattern should be subject to an additional or a minor or an unchanged delay, with regard to the transmit data pattern, so as to achieve an improved or more ideal synchronization of data interface 210. In accordance with this analysis, phase detector 250 is now in a position to output a respective correction signal to delay circuit 260, as is indicated in FIG. 2 by the arrow from phase detector 250 to delay circuit 260, so that it will forward any data signals which will arrive in future with an altered delay.

It is to be noted in this context that in the embodiment of a memory controller 200, depicted in FIG. 2, just like in the embodiment of a memory circuit 100, shown in FIG. 1, data interfaces 210, 140 and command/address interfaces 220, 160 may comprise more than one data line. In this case, the components in question to which the interfaces are connected are typically configured to process signals which arrive in parallel accordingly, or to generate respective signals. In the case of the embodiment of a memory controller 200, depicted in FIG. 2, this means, for example, that for each or at least for a plurality of the signal lines, an individual delay circuit 260 may be implemented within the framework of the synchronization circuit 230.

In this case, phase detector 250 may be configured, for example, such that it determines those pieces of correction information or correction signals which are to be output to delay circuit 260 in such a manner that it compares the mutual phase positions of the individual signals which via the different signal lines of the data interface via delay circuit 260, or delay circuits 260, the comparison being such that within an acceptable, for example pre-determined or specified tolerance threshold, the receive data pattern will match the transmit data pattern with regard to the plurality of signal lines.

In other words, phase detector 250 may be configured, in embodiments of a memory controller 200, such that it compares the receive data, which come in on different signal lines, in the manner which is modified by the delay circuit 260, such that said receive data is synchronized, by suitable delays, such that this data will match the transmit data pattern within a specified tolerance. To this end, phase detector 250 may be able, for example, to forward respective correction signals to delay circuit 260, or to the various delay circuits 260, so that any signals arriving in the future from the data interface will arrive with an improved or, ideally, optimum synchronization, and that it will be possible to process them within the framework of memory controller 200.

If, for example in the case of at least two signal lines of data interface 210, the signals, measured by phase detector 250, of the first and second signal lines differ with regard to the transmit data pattern in such a manner that the first signal of the receive data pattern is received too early, with regard to the second signal of the receive data pattern, from phase detector 250, the latter may instruct delay circuit 260 to further delay the signal on the first data line, to cause less delay in the data signal on the second data line, or to implement a combination of the two possibilities mentioned above. In this manner, it is possible for the synchronization circuit 230 in the embodiment described to mutually equalize the respective phase shifts of the individual signal lines of data interface 210.

Depending on the specific implementation, or on the embodiment employed, clock-like signals, de Bruin signals, random data patterns and/or data signals, jagged rectangle patterns or jagged delta patterns (stop bit patterns) or other pre-determined signals, for example stored within a read-only memory, may be generated, for example, by the signal generator, or pattern generator, and be output as respective data patterns. For example, depending on the envisaged possibility of use, a respective embodiment of a memory controller 200 offers the possibility of conducting a data pattern transfer, adapted to the respective application requirement, or to the respective operating situation, to an embodiment of a memory circuit 100 as is shown in FIG. 1, on the basis of different data patterns which may be set, for example, by the user. In the case of the de Bruin signals, or de Bruin codes, these enable, for example in the event of the codes having an overall length of 8 bits, making a statement with regard to the phase position by comparing only 3 bits of the data stream with one another. Thus, for example in embodiments of a memory controller 200, a phase detector 250, or a comparator which may possibly be integrated therein, may be significantly simplified, since a significantly reduced number of bits need to be compared with one another than in the case of other signals which require a comparison of all of the bits or codes. Anyway, this is not to be seen as a limitation, since one embodiment of a memory controller 200 offers the very flexibility of generating, via pattern generator 240, or signal generator 240, any signals or data patterns desired by the user, and to use them for synchronization.

In addition, within the framework of embodiments of a memory controller 200, as is shown in FIG. 2 by way of example, further synchronization methods may be implemented which include, for example, the so-called clock and data recovery method as is known to those skilled in the art. Moreover, within the framework of embodiments of a memory controller 200, synchronization methods may be implemented which enable, for example, synchronization to a data eye and/or to larger data sets. These larger data sets may include, for example, so-called synchronization methods for frame synchronization, or methods for synchronization with regard to a burst of data.

Figure 3:
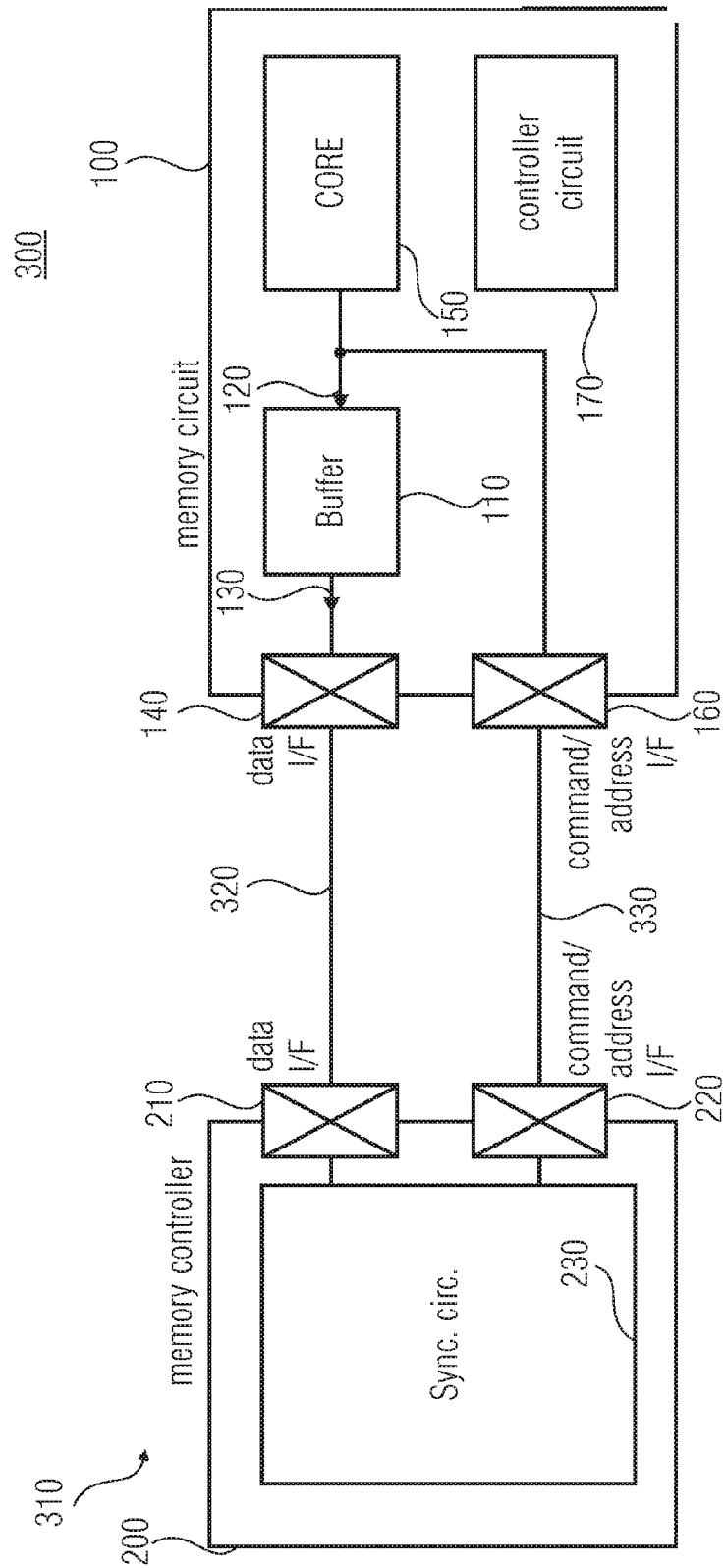
FIG. 3 shows a block diagram of an embodiment of a memory system comprising an embodiment of a controller in the form of a memory controller, and an embodiment of a circuit in the form of a memory circuit.

Before describing an embodiment of a memory system in the context of FIG. 3, it is useful to point out that objects, structures and components having identical or similar functionalities or similar functional features and properties shall be designated by identical reference numerals. Unless explicitly indicated otherwise, in these cases sections of the description which relate to objects, structures and components having similar or identical functional features and properties may be interchanged and/or mutually supplemented. Also, in the further course of the present application, summarizing reference numerals will be used for objects, structures and components which occur in an identical or similar manner in one embodiment or in several embodiments in an identical or similar manner, designated with the same summarizing reference numerals, unless a specific functional property, a specific functional feature of a specific object, of a specific structure or of a specific component is discussed, or explained. Using summarizing reference numerals therefore allows, in particular, a shorter and more compact description of embodiments of the present invention.

FIG. 3 shows an embodiment of a memory system 300 wherein one embodiment of a memory controller 200 and one embodiment of a memory circuit 100 are coupled to each other via respective data interfaces 140, 210 and command/address interfaces 160, 220. Specifically, the embodiment of a memory controller 200 depicted in FIG. 3 is an embodiment as is shown, for example, in FIG. 2. By analogy therewith, memory circuit 100 is an embodiment as is shown, for example, in FIG. 1. For this reason, reference shall be made to the respective passages of the present patent application with regard to the internal structure, mode of operation and further features as well as their alternatives. Both memory controller 200 and memory circuit 100 comprise, in the embodiment of a memory system 300 depicted in FIG. 3, the objects described in the context of FIGS. 1 and 2 which are designated by the reference numerals used there. Depending on the specific implementation, the embodiment of a memory system 300 depicted in FIG. 3 may be a graphics system 300 or a graphics memory system. As was explained above, these may be configured, e.g., entirely as one single integrated circuit, from several wired integrated circuits, as a combination of integrated and discrete circuits, or entirely as a discrete circuit.

Data interfaces 140, 210 of memory circuit 100 and of memory controller 200 are coupled to one another here, as is also the case for the two command/address interfaces 160, 220 of the two components. In this context, the coupling may be realized, for example, via respective sockets for the individual devices and conductive traces on a board 310 (PCT, printed card board). In the embodiment of a memory system 300 depicted in FIG. 3, data interfaces 140, 210 are coupled, for example, to one another via a data bus system 320 and a command/address bus system 330 on the board 310. Likewise, direct cabling or a different electrically conductive connection between the two components 100, 200 are also possible, of course.

Memory controller 200 may be a GPU 200 (graphic processor unit), for example, and memory circuit 100 may be a GDDRx memory circuit 100 (GDDR=graphics double data rate), for example, x being a natural number specifying the standard of the device in question. Thus, memory circuit 100 may be, for example, a GDDR5 memory circuit (x=5), so that memory controller 200 may be a GDDR5-compatible GPU 200.

A synchronization of the embodiment of a memory system 300, or of a graphics system 300 (in the event of appropriate graphics components 100, 200), depicted in FIG. 3, now comprises outputting the transmit data pattern via command/address interface 220 of memory controller 200, which is also received via command/address interface 160 of memory circuit 100 and is latched, or buffered, within output buffer 110 of memory circuit 100 at the instigation of controller circuit 170. For example, upon a command of memory controller 200, or on the basis of an internal command of controller circuit 170 of memory circuit 100 (e.g. after a predetermined time period has elapsed), data pattern 110 which is stored within output buffer 110 and which (essentially) is the transmit data pattern, may now be transmitted via data interface 140 of the memory circuit. The transmit data pattern thus becomes the receive data pattern once it is output by memory circuit 100 and is received by memory controller 200 via data interface 210 of memory controller 200. As was already explained above, the receive data pattern may be forwarded, via data interface 210, to synchronization circuit 230 within memory controller 200, which will then be able to set data interface 210 of memory controller 200, on the basis of the transmit data pattern and of the receive data pattern, such that any delays and other signal corruptions which may occur will be compensated for by synchronization circuit 230.

Embodiments of memory systems 300 or graphics systems 300 as are depicted, for example, in FIG. 3 may be employed, for example, within the context of computer systems, i.e., for example, in the field of personal computers (PCs) or other computer systems, such as game consoles or high-end graphics systems. Applications in the high-end field, i.e., for example, in the production of TV or film sequences, are also feasible.

In addition, both embodiments of memory controller 200 and embodiments of memory circuit 100 may comprise additional components, such as circuits for synchronization, PLL circuit (phase-locked loop). Also, the above-mentioned components may naturally also contain further components which are available for additional functionalities within the framework of the circuits in question. Examples of this will be given in the further course of the application.

Embodiments of memory systems 300, or of graphics memory systems 300, as are depicted in FIG. 3, may be implemented, for example, within the framework of graphics boards or other graphics subsystems for notebooks, high-end computer systems or other computer systems. In addition, embodiments of memory systems 300 may also be employed within the framework of main-memory systems of computer systems, as well as within the framework of application-specific memory systems. Examples of such application-specific memory systems are, for example, cache memory systems, which, having a particularly high system clock and/or a particularly fast data storage/reading speed, allow latching of data frequently accessed by a processor, for example a CPU (central processing unit) or GPU (graphics processing unit). In addition, respective application-specific memory systems also occur in the field of mass memories (e.g. in hard disk storage) and other fields of application.

Within the framework of embodiments of a memory system 300 as well as within the framework of embodiments of memory circuits 100, most varied types of memories may be employed within the framework of memory core 150. In addition to DRAM memory cores (DRAM=dynamic random access memory) and SRAM memory cores 150 (SRAM=static random access memory), non-volatile memory cores, i.e. flash FET memory cores or other non-volatile storage techniques, may also be employed. Thus, a memory core 150 may be employed with different technologies, depending on the application envisaged. Crucial factors influencing the selection of the memory technology used for memory core 150 include, among others, the amount of memory envisaged, the storage density envisaged, the energy consumption, the writing speed, the reading speed, and the question concerning the volatility of the information stored. It may be of interest, for example in embodiments of appropriate memory systems 300 and appropriate memory circuits 100 for utilisation in the field of cache memory systems, to implement SRAM memory cores 150 since they have a high (writing/reading) speed. In the event of high storage densities and of large amounts of memory, i.e. in the field of the main memory of computer systems or in the field of graphics memory systems, the use of DRAM memory cores may be more of interest. In addition, there is naturally always the possibility, in principle, of implementing these within the framework of ODR architectures (ODR=octal data rate), QDR architectures (QDR=quad data rate), DDR architectures (DDR=double data rate), or within the framework of SDR architectures (SDR=single data rate) with regard to the underlying clock frequency. In principle, one may therefore state that the memory-core technology is not limited to a specific technology. In principle, magnetic or optical memory systems may therefore also be employed as the memory core 150. Examples of a magnetic memory system could be, for example, MRAM memory cells (MRAM=magnetic random access memory) or phase-shift memory cells.

In particular, embodiments of memory circuits, memory controllers and memory systems which originate in the field of computer graphics or other imagining systems as may also be employed in the field of television and movies shall be discussed below. Embodiments of the present invention relate to embodiments of memory circuits, memory controllers and memory systems which may be implemented, for example, within the framework of modern graphics applications. However, they may also be applied in the field of other computer systems.

Modern computer systems and many applications of modern computer systems nowadays require a constantly increasing memory capacity, since, for example, the complexity and the number of details that have to be taken into account within the context of an appropriate software application increase fast. Examples of this may be found in the fields of technical, economic, social and scientific simulation, which deals with, for example, the behaviors of complex systems. Further examples may also be found in the field of data processing, data mining and other memory-intensive processes.

Such applications typically require not only a very large memory space on magnetic disc drives, optical disk drives, magnetic or optical tape drives or other memory systems which are able to store and archive large amounts of data, but frequently also require a main memory or an application-specific memory comprising a continually growing memory space which may be accessed fast and reliably. Examples of this may be found, on the one hand, in the field of servers and work stations, and in the field of computer graphics, i.e., for example, in the field of graphics boards, graphics subsystems or other graphics systems which are possibly integrated. Especially in the field of graphics applications, what results here, for example, are requirements caused by simulation of complex and high-detail surfaces, objects and structures, wherein most varied environmental influences, textures and other parameters are to be taken into account.

In order to enable the requirements of, specifically, modern computer systems and graphics systems with regard to fast access to the main memory or the application-specific memory, interfaces between the components in question are frequently operated in the field of critical interface parameters so as to achieve the necessary speed within the context of data transmission. Frequently, a training procedure is performed in this context which is supposed to ensure the critical interface parameters for achieving the required speed. Here, a whole sequence of individual-training procedures is run until the component(s) in question may be utilized within the framework of their specifications. For example, such training sequences serve to take into account, or to compensate for, manufacturing-induced parameter differences within the context of a power-up process. But also thereafter, i.e. during actual operation, the unit, or the respective components, are frequently re-calibrated in a periodic manner to compensate for any drift of operation-induced parameters which include, for example, the precise temperature values, the precise voltage values and the phase positions of the respective signals and/or signal lines.

In the further course of the present application, applications derived from the field of computer graphics will also be discussed. Even if embodiments within the framework of the high-speed graphics DRAM standard GDDR5 will be dealt with in particular below, the preceding discussion of alternative embodiments and implementations has shown that embodiments of a memory circuit 100, of a memory controller 200 and of a memory system 300 are limited neither to graphics memory systems, its components, to DDR DRAM memory systems, nor to other components. Rather, the following discussion of embodiments presents merely an embodiment, or several embodiments, of the components in question.

Before discussing embodiments from the field of GDDR5 memory technology in the following, several aspects of GDDR5 memory technology shall be initially discussed to further understanding. For example, GDDR5 memory technology bets on training the critical interface parameters to achieve the speed envisaged which may be in the range of, for example, 4 Gbit/s per pin of the data interfaces. In principle, however, deviating data transfer rates which may deviate both in the upward and in the downward directions from the 4 Gbit/s per pin mentioned are also feasible.

Here, GDDR5 DRAM memory circuits 100 typically comprise interfaces of various classes of speed. The target speed of the above-mentioned 4 Gbit/s per pin here typically relates to the data signals lines of data interface 140 of an embodiment of a memory circuit 100. This data rate may be achieved, for example, by using a DDR architecture with regard to a write clock signal or reference clock signal for the data, or data signals, the write clock signal WCK in this case comprising a frequency of about 2 GHz. Alternatively, such a data rate (4 Gbit/s/pin) may also be achieved by a QDR architecture (QDR=quad. data rate) with regard to a clock signal CK. In the event of the above-mentioned target speed of 4 Gbit/s/pin, clock signal CK would correspond to a frequency of about 1 GHz. In addition to the data interface, an error detection code signal (EDC) could also be operated as independent pins, and/or also within the context of the data interface, at the same target speed, i.e., for example, 4 Gbit/s/pin, so that this data rate may also be implemented via a DDR architecture with regard to the write clock signal WCK, or, within the framework of a QDR architecture, with regard to clock signal CK.

With memory systems having the above-mentioned target speed, the address interface and/or the command/address interface frequently operates at a lower speed, for example at a speed of 2 Gbit/s/pin, which may be realized, for example, within the context of a DDR architecture with regard to clock signal CK (1 GHz). In addition, commands may also be realized with a target speed which is lower still, for example 1 Gbit/s/pin, and which may be implemented, for example, within the framework of an SDR architecture with regard to clock signal CK.

Here, both clock signals CK and WCK may be transferred from an embodiment of a memory controller 200 to an embodiment of a memory circuit 100. As was already explained above, the abbreviation SDR here stands for single data rate, the abbreviation DDR for double data rate, and the abbreviation QDR for quad data rate. Here, the respective first letters S, D, Q designate the number of the bit count, per pin, transmitted per clock cycle of the underlying clock signal. Within the framework of an SDR architecture, 1 bit per clock cycle and pin is consequently transmitted (S=single), whereas in the case of a DDR architecture, 2 bits are transmitted per data line and clock cycle (d=double). In the case of the DDR architecture, for example, 1 bit may be transmitted in each case in the event of a rising edge of the respective clock signal, and 1 bit may be transferred within the framework of a falling edge of the respective clock signal, i.e. a total of 2 bits per clock cycle and pin (D=double) may be transmitted. Accordingly, within the framework of a QDR architecture, 4 bits are transmitted per clock cycle and pin (Q=quad), and within the framework of an ODR architecture, 8 bits are transmitted per clock cycle and pin (0=octal).

With regard to synchronization, i.e. with regard to the training concerning the interface parameters, the most critical interface is bound to be that data interface which in the case of a so-called x32-organized GDDR5 DRAM memory module, or memory circuit 32, includes data signals DQ, referred to DQ[31:0], four data inverting signals DBI, referred to as DBI[3:0], four error detection code signals EDC, referred to as EDC[3:0], and two write clock signals for data or reference clock signals for data WCK, referred to as WCK01 and WCK23. Here, the addresses of the respective signals lines, or of the respective signals, are indicated in the square brackets.

Within the framework of the GDDR5 memory concept, the parameters with regard to synchronization, and/or of timing, are not set by the memory circuit, which is colloquially frequently also simply referred to as DRAM, but by the memory controller, which is frequently simply only referred to as controller. Within the framework of this architecture, it is consequently only the memory circuit which outputs feedback information about how a piece of information, or a signal, of the memory controller was received. After power-up, a general training sequence for the interface parameters may comprise the following steps:

1. Address Training (Double Data Rate Addresses and/or Address Interface)

Within the framework of the address training, the DDR address bus which operates with regard to clock signal CK, for example, is set by a respective training program with regard to its interface parameters. Here, one may assume that any useful signals or command signals which may possibly be required operate in a stable manner from the very beginning. Here, the DDR addresses are trained with a specific training sequence, the memory controller, or the controller, setting its timing. In many implementations, the above-mentioned address interface represents part of the command/address interface, since the data lines of the command/address interface for transmitting address information to the memory circuit are utilized, in some operating situations, for transmitting command sequences, or subcommand sequences, since in these operating conditions, respective transmission of address information may be dispensed with.

2. WCK2CK Alignment

Within the context of this step, the memory controller performs a synchronization, or an alignment, of the two clock signals CK and WCK which may be effected, for example, using a PLL technique.

3. Initial Read Training for Data Signals DQ, Data Inverting Signals DBI, and Error Detection Code Signal EDC.

Within the framework of this training, or this training step, the data lines of the data interface are initially synchronized, within the framework of a symbol training, such that the memory controller is in a position to determine the signals exhibiting a sufficiently high signal quality. Here, for example, the phase position of the individual data lines may be shifted, by the memory controller, such that the respective clock signals come to lie right in the center of the data eyes of the data signals.

In a further training substep, so-called frame synchronization is subsequently conducted, wherein, for example, the overall phase position, or the individual phase position, of the data lines is set such that the memory controller may read and receive the fed-back data of the memory circuit. To this end, for example, a phase detector may be implemented within the memory circuit which transmits information regarding the phase position to the memory controller.

4. Write Training Using the Read FIFO.

Within the context of this training step, symbol training and, subsequently, frame synchronization is performed which is performed using the output buffer of the memory circuit, this buffer frequently also being referred to as a so-called read FIFO, since it is used for reading data from the memory circuit. The buffer, or output buffer, which is used within a memory circuit frequently comprises not only one single buffer stage, but typically comprises a plurality of, for example at least four, buffer stages, so that within the memory circuit, several data packets may be stored into different stages of the buffer before they are output via the data interface. So that the order of the data in question is not changed, such a buffer is frequently implemented as a so-called FIFO (first in first out) buffer, wherein the data which is written into the buffer first will be the first to leave it. It is for this reason that, in the case of a GDDR5 memory circuit, the buffer, or output buffer, is frequently also referred to as FIFO or read FIFO.

5. Fine-Read Training Using the Read FIFO.

In a further step of the training sequence after power-up, a fine-symbol training is again performed using the buffer, or the read FIFO, so as to be able to re-examine and, possibly, optimize the signal quality and transmission quality.

As the above list of the general training sequence has shown, that interface which is the next up in terms of speed is powered up on the basis of that interface which is the next down in terms of speed, respectively. In other words, that interface which is slower, respectively, is to power up the next interface up in terms of speed.

As was already explained above, a respective training sequence is run through not only within the context of powering up a memory system, but a sequence of individual trainings is quite possibly also performed during the operation, for example is conducted periodically so as to perform a re-calibration of the interface parameters. In this manner, a parameter drift which is due, for example, to variations of the temperatures, the voltage values or of the phase positions of the individual signals, may be compensated for.

As the above-listed training sequence has shown, in the GDDR5 standard the output buffer, or the read FIFO, which exists in many modern DRAM memory modules, or DRAM memory circuits, is used for the training of the data interface. In normal operation, the output buffer frequently serves to balance access speed differences and to enable a change of the time signal domain and/or of the clock signal domain. More specifically, the output buffer enables the change of clock signal CK, which is also referred to as command clock, to data clock signal WCK.

To this end, in the GDDR5 standard, two extra commands have been introduced, i.e. the so-called WRTR command (write training), which enables writing data into the output buffer (READ FIFO), and the RDTR command (read training), which enables reading the data from the output buffer. In this manner, the memory controller, or the controller, or the GPU, has the possibility of writing data into, and reading it from, the memory circuit without touching the normal memory core, also referred to as DRAM memory array, so that the useful data stored within the memory core remains unchanged, for example, during normal operation.

Since during power-up, typically neither a write operation nor a read operation will function on account of the non-calibrated data interfaces, the interface cannot be trained using the WRTR command and the RDTR command. Typically, it is advisable to previously train the respective interface with regard to reading, before a write training may be initiated. For the initial read training, a known pattern, or data pattern, is frequently used which may be evaluated by the memory controller. Using this pattern which is known to the memory controller, the memory controller can then perform a symbol synchronization and a frame synchronization, as was explained above. The length and complexity of the initial training pattern here play a decisive role in determining the quality of the read training and, thus, the speed with which a subsequent write training may be performed.

As was explained above, it may be advisable, but not necessary, to utilize, within the framework of the initial read training, a data pattern known to a memory controller. If it is a simple pattern, for example a clock signal-like pattern, this will frequently enable very fast synchronization, and/or very fast locking of the phases. In the case of more complex patterns, moreover, patterns may be implemented which also take into account cross-talk effects, or X-talk effects, and inter-symbol interference effects, or ISI effects, so that a stable determination of the sampling spots becomes possible.

If the data pattern is too simple, or too short, however, it may happen that the cross-talk effect and the inter-symbol interference effects may therefore not be fully detected. This may cause training results to become very imprecise, so that, for example, the data is not evaluated, or sampled, in an ideal data-eye center on the part of the memory controller. In other words, the sampling moment may, in the case of an RDTR command, not have been sufficiently well defined when complex data patterns are used within the framework of a WRTR command. This may result in that, under certain circumstances, for example, the training procedure is terminated during the write training. Thus, for example within the framework of the write training, complex data patterns may be written into the output buffer using the WRTR command, said complex data patterns being sensitive to cross-talk effects and inter-symbol interference effects. In a subsequent reading-out using the RDTR command, it may possibly happen that the memory controller, or GPU, cannot read back these data patterns, since the read sample point is not defined with sufficient accuracy on the part of the memory controller. Then the memory controller can no longer differentiate whether there is a problem within the framework of the write training or a problem within the framework of the read training, so that the entire training may possibly fail.

Embodiments of a memory circuit 100, a memory controller 200, and a memory system 300 now enable filling the output buffer, or FIFO, with various simple or complex patterns which may be selected by a user, and to thus pre-initialize the output buffer, so that thereafter, one or several read training sequences may be employed on the basis of the RDTR command from the buffer. Also, it is possible to perform one or several write training sequences using the WRTR command, and, possibly, one or several training sequences within the framework of a fine read training on the basis of the RDTR command. Here, embodiments of a memory circuit, a memory controller, and a memory system enable to flexibly fill the output buffer of the memory circuit via a reliable, calibrated path in the form of the command address interface. Embodiments of a memory controller, a memory circuit, and a memory system may be pre-initialized, depending on the layout of the buffers of the memory circuit, for example with several, user-specific, simple and complex data patterns for various training sequences, so that the training sequence may, all in all, be performed in a very flexible, very fast or very accurate manner, depending on the user's preference. The data patterns transferred to the output buffer may thus be configured, for example, to be sensitive to cross-talk effects and to inter-symbol interference effects.

Depending on the specific implementation of an embodiment of the present invention, the initialization of the output buffer of the memory circuit may be performed at the full working frequency of the memory circuit, or at any other frequency, or clock frequency. In the case of an embodiment of a memory circuit in the form of a GDDR5 memory circuit, which typically comprises at least four buffer stages as the buffer depth, a pattern length will thus result, for example, as a product of the so-called burst length (per PIN), and of the buffer depth. A burst length of 8 bits and a buffer depth of at least 4 buffer stages, thus results in a pattern length of at least (8·4=32) 32 BIT per PIN.

Embodiments of a memory circuit, a memory controller, and a memory system thus enable to initialize the output buffer with flexible data patterns which may be, for example, clock signal-like, while taking into account a cross-talk sensitive pattern, random or jagged delta-like (stop bit pattern). Embodiments of the present invention thus enable a (pre-) initialization of the output buffer with complex data patterns which enable, for example, a read training accurate enough to thereafter train a writing while using the WRTR command.

Using a command LDFF (load FIFO), embodiments of the present invention enable to load data, for example "address values" or "address data", which are transferred to an embodiment of a memory circuit via the command/address interface, directly into the output buffer (READ FIFO). Depending on the specific implementation of an embodiment, a bypass line may be re-used, for example, for an address training, or a data line may be used for address-based data masks within the context of the initial read training of an embodiment of a GDDR5 memory circuit. The above-described LDFF command (load FIFO) thus represents, in some embodiments, the third signal which causes the controller circuit of the memory circuit to forward data received at the command/address interface to the input of the output buffer, so that the latter stores the data within the output buffer. In embodiments of the present invention, the output buffer of a memory circuit may thus be initialized with address data by means of the specific load command LDFF.

In some embodiments, a situation may arise wherein several output buffer load commands LDFF are required to fill one single buffer stage, since it may happen that in embodiments of the present invention the number of address bits which may be transferred via the command/address interface is much smaller than the number of data bits output with any data read command. Depending on the specific implementation, for example 80 bits per data byte and data burst may be output, for example, within the framework of each data read command, as will be explained in more detail in the further course of the present application. Irrespective thereof, embodiments of a memory controller, a memory system, and a memory circuit may offer the advantages that a very high level of flexibility with, at the same time, a long length of the data pattern known to the memory controller may be generated in this manner in an embodiment of a memory circuit. In addition, embodiments of the present invention may provide the further advantage that their additional area requirements are insignificant.

FIG. 4 shows a further embodiment of a memory circuit 100, wherein controller circuit 170, or global control or global control unit 170, is not depicted in order to simplify the representation. The embodiment of a memory circuit 100 shown in FIG. 4 in turn comprises a data interface 140, which is designated as DQs+DBIs in FIG. 4 on the basis of the previously explained designation of the data signal lines and the data inverting signal lines. Data interface 140 in the embodiment shown in FIG. 4 is a bidirectional interface, so that the data interface is coupled, on the one hand, to a receive driver circuit 400 also referred to as RX, and to a transmit driver circuit 410 also referred to as TX in FIG. 4. Data interface 140 is coupled to an input of receive driver circuit 400, and to an output of transmit driver circuit 410. As a consequence, data interface 140 is not only able to transmit, via transmit driver circuit 410, data to a component which is external in relation to memory circuit 100, but also to receive appropriate data via data interface 140. In the embodiment depicted in FIG. 4, an output of receive driver circuit 400 is coupled to a bidirectional bus, or a bidirectional bus structure, 420, which in turn couples the output buffer, or FIFO, 110 and memory core 150 to one another. More specifically, bidirectional bus 420 is coupled to input 120 of buffer circuit 110. Output 130 of output buffer 110 is coupled to an input of transmit driver circuit 410, so that any data stored within output buffer 110 may be output via transmit driver circuit 410 and data interface 140.

In addition, a processing circuit 430 is connected to bidirectional bus 420 in such a manner that data which is transported via bidirectional bus 420 may arrive at processing circuit 430. In the embodiment shown in FIG. 4, processing circuit 430 is, more specifically, an EDC calculating circuit, or EDC circuit, also referred to EDC-CALC in FIG. 4. In the embodiment shown in FIG. 4, the EDC circuit, or EDC calculating circuit, is configured to calculate, on the basis of the incoming data from bidirectional bus 420, a check value, or a check sum, by means of which the presence of an error may be identified. The EDC circuit (EDC=error detection code) may, for example, on the basis of a parity check across individual or several parity bits, by means of calculating an CRC check sum (CRC=cyclic redundancy check), by calculating hash values, by calculating a hamming check sum, or by means of any other error-detecting and/or error-correcting check sum calculation. In other embodiments of a memory circuit, processing circuit 430 may naturally take on other functions including, for example, encryption or decryption or other data-processing calculations.

EDC circuit 430 is coupled, via an output and a unidirectional bus 435 or a signal line 435, to a second output buffer 440, which in turn is coupled, via a further transmit driver circuit 450, referred to again as TX in FIG. 4, to at least one further pin 460, by means of which the check sums, or EDC values, may be utilized for a component which is external in relation to memory circuit 100. For this reason, the further pin 460 is also referred to as EDCs. In this context, it is worth noting that depending on the embodiment of a memory circuit 100, the further pin 460, also referred to as EDC pin, may also be part of data interface 140. In other words, EDC pin 460 may also be included in data interface 140.

In a memory system as is shown, for example, within the framework of the embodiment shown there in FIG. 3, such an embodiment of a memory circuit 100, as is shown in FIG. 4, is in a position to transmit a check value, or a check sum, via the EDC pin 460, on the one hand, of the memory controller, when the memory controller has transmitted data to memory circuit 100, so that the memory controller may identify, and possibly correct, any error which may occur within the context of the transport of the data. A correction may be performed, for example, in that the data in question is re-written. Of course, other error correction measures are also possible within the context of the memory controller.

In addition, EDC circuit 430, second output buffer 440, the further transmit driver circuit 450, and further pin 460 enable a parallel transmission, which optionally is slightly offset in time, of a check sum in the event of an operation of reading data from memory core 150, and of a respective transmission via data interface 140 to memory controller 200 which, however, is not shown in FIG. 4.

The embodiment of a memory controller 100, shown in FIG. 4, in turn further comprises a command/address interface 160 which is coupled to memory core 150 via a further receive driver circuit 470 via an address path 480, so as to allow, for example, addressing a specific memory location, or several memory locations within the context of a write operation or a read operation within memory core 150. In addition, the embodiment of a memory circuit 100 comprises a temporary memory 490 coupled, on the one hand, to address path 480 via an input, and, on the one hand, to bidirectional bus 420 via one or several outputs, and, on the other hand, to a bus structure 435 connecting EDC circuit 430 and second output buffer 440, such that data within temporary memory 490 may be coupled into both bus structures.

Thus, an embodiment of a memory circuit 100, as is shown in FIG. 4, in turn enables data which is received via command/address interface 160 within memory circuit 100 to be transferred into output buffer 110 via temporary memory 490 and bidirectional bus 420, so that this data, or these data patterns, may further be sent via transmit driver circuit 410, for example within the context of a training operation of data interface 140, via same. In addition, the embodiment shown in FIG. 4 also enables to possibly couple respective data or data patterns received via the command/address interface, into unidirectional bus 435 via temporary memory 490, so as to accordingly also transfer data or some of the data received at the command/address interface, into second output buffer 440, also referred to as EDC-FIFO because of its functionality, so that it may also be output to the further pin, or EDC pin, 460 via the further transmit driver circuit 450.

Depending on the specific implementation of an embodiment of a memory circuit 100, in addition to temporary memory 490 a further, or second, temporary memory may also be implemented via which the data which is received at command/address interface 160 may be coupled into bus 435. Also, it is possible, in principle, to employ any memory elements and/or temporary memories which already exist as the temporary memories 490 in question within the context of buses 420, 435. Such an embodiment will be explained below in more detail with reference to FIG. 6.

FIG. 5 shows a further embodiment of a memory circuit 100 which differs from the embodiment of a memory circuit 100 shown in FIG. 4 only with regard to the use of bidirectional bus 420 in FIG. 4. More specifically, in the embodiment shown in FIG. 4, bidirectional bus 420 which interconnects output buffer 110 and memory core 150 has been replaced by a bidirectional bus 500, or a unidirectional bus structure 500, which enables only a transport of data in the direction to input 120 of output buffer 110. Irrespectively thereof, however, both temporary memory 490 and EDC circuit 430 are coupled, as a processing circuit, to unidirectional bus 500 such that, again, EDC circuit 430 may receive data from bus 500, and that temporary memory 490 may couple data into bus 500. However, since unidirectional bus 500 is not able, in the embodiment shown in FIG. 5, to transfer data which is fed into bus 500 to memory core 150, receive driver circuit 400 is directly coupled to memory core 150 and EDC circuit 430, in contrast to the embodiment shown in FIG. 4, so as to be able to store, on the one hand, the data which has been received via data interface 140 into memory core 150, and to be able, on the other hand, to calculate a check sum by means of EDC circuit 430 within the context of the confirmation of a write operation, without the respective data having to be read out again from memory core 150 via unidirectional bus 500 within the context of a read operation. Thus, the described coupling of receive driver circuit 400 to memory core 150, on the one hand, and EDC circuit 430, on the other hand, enables transmission of the data which has been received directly at data interface 140 to EDC circuit 430, so that same may determine, or calculate, a check sum without it being necessary to store the data within memory core 150 prior to this.

The embodiments shown in FIGS. 4 and 5 thus differ in that the embodiment depicted in FIG. 4 corresponds to a FIFO load principle in the case of a DRAM memory circuit comprising a bidirectional data bus 420, while the embodiment shown in FIG. 5 may be based, for example, on the basis of the FIFO load principle, in the case of a DRAM memory circuit comprising a unidirectional data bus 500. Of course, it should be noted again at this point that in the embodiments shown in FIGS. 4 and 5, the alternative memory-core technologies which have already been explained above may also be used, in principle, as the memory cores 150, and that the embodiments depicted in FIGS. 4 and 5 are not limited to DRAM technology.

The embodiments depicted in FIGS. 4 and 5 thus also illustrate the utilization, which may be realized in the embodiment of a memory circuit 100, of the reliable, pre-conditioned command/address interface 160 to initialize output buffer 110 (READ FIFO) for the read training. For this purpose, a connection, which frequently does not exist, from command/address interface 160, or from address path 480, to output buffer 110 (FIFO) is established. In some embodiments, as are shown, for example, in FIGS. 4 and 5, sequential writing of the "address data", i.e. of that data which is received via command/address interface 160, into an extra temporary memory 490 is possible until the temporary memory, or memories, 490 have a sufficiently large amount of data collected therein which will only then be written into output buffer 110 or output buffers 110, 460.

Put differently, the embodiments of a memory circuit 100 as are shown, for example, in FIGS. 4 and 5, allow to transmit the "address data" into FIFO 110 not before the amount of data necessary for a burst or for a data output is present in its entirety. Depending on the specific implementation of embodiments, this may mean, for example, that the "address data" in question is not transmitted into FIFO 110 until a full burst comprising 8 bits has come in via command/address interface 160 for each pin of data interface 140.

As was also previously explained, in some embodiments of a memory circuit 100, the read/write data bus 420, 500, which leads to output buffer 110 (FIFO), may possibly be used as a temporary memory 490. Frequently it is precisely bidirectional buses 420 and unidirectional buses 500 which exhibit memory cells or so-called hold latches which may then take over the respective memory function.

In conjunction with FIGS. 6 and 7, further embodiments of a memory circuit 100 as may be employed, for example, in the context of GDDR5 memory modules or memory circuits shall be explained below. Specifically, FIG. 6 shows an embodiment of a GDDR5 training system in detail for an individual write channel, more specifically for the so-called 0 byte of the data interface.

Thus, FIG. 6 shows part of the infrastructure of an embodiment of a memory circuit 100, wherein at least part of data interface 140 is in turn coupled via a receive driver circuit 400 and a transmit driver circuit 410. More specifically, the part of the data interface which is depicted in FIG. 6 is data lines DQ0, . . . , DQ7 and DBI0, so that a total of nine data signals, which in FIG. 6 are designated by indices "<8:0>", are transmitted in parallel, respectively, via that part of data interface 140 which is depicted in FIG. 6. For this reason, receive driver circuits 400 and transmit driver circuit 410 are also such circuits which may process accordingly all of those 9 data lines which are numbered by indices 0 to 8. Receive driver circuit 400 and transmit driver circuit 410 may, for example, adjust the signal levels and other signal properties and features to match the subsequent components and their requirements.

Thus, that part of data interface 140 which is shown in FIG. 6 is coupled, via receive driver circuit 400, to a serial/parallel converter circuit 510 (Ser2 Par) which enables a conversion of the clock frequencies and operating frequencies of the external communication and the internal core speed. Since, as has already been explained before, a target speed of 4 Gps (giga-bit per second and pin) may be achieved, for example, within the context of the GDDR5 standard, the receive driver circuit transmits on a total of nine data lines of 4 Gbit/s each, which is converted to the internal core speed of the memory circuit by conversion circuit 510, a total of 72 data signals being generated from the incoming nine data lines, said 72 data signals each being transmitted on a data line of their own. Here, for example, the data may be transmitted up to the input of conversion circuit 510 within the framework of a DDR architecture at a frequency of 2 GHz, which is present in the WCK domain. Conversion circuit 510 then reduces the transmission frequency of 2 GHz to the core speed of, for example, 500 MHz, and at the same represents a transition in an SDR architecture, so that a total of eight data signals are generated on eight data lines from each incoming data line. This data which is present at the output of conversion circuit 510 is also referred to as write data.

The output of conversion circuit 510 is coupled to an input of a 72-fold signal memory circuit 520 also referred to as a latch. From controller circuit, or global control, 170, latch 520 obtains a respective clock signal which, on the one hand, also operates in the core domain, i.e. at the core speed of 500 MHz, and is also referred to Write Strobe or WRTR Strobe. In the embodiment depicted in FIG. 6, global control 170 transmits a multitude of clock signals or other triggering signals including, for example, the EDC_Strobe, LDFF_Strobe, LDFF enable, WRTR_Flag, LDFF_Flag, Read_Strobe and RDTR_Strobe signals. In addition, global control 170 may output further respective signals, as is indicated on the left-hand side of global control 170. Also, depending on the specific implementation of an embodiment of a memory circuit 100, global control 170 may also be configured such that these external signals, for example from the memory controller of an embodiment of a memory system, may be received and evaluated.

One output of latch 520 is connected, among others, to a DBI reversing circuit 530 via a data bus which comprises 72 data lines and operates at the core speed of the core domain of 500 MHz, the DBI reversing circuit 530 being coupled, in turn, to memory core 150 via an output and a data bus structure having a width of 64 bits. The DBI reversing circuit 530 (reverse DBI) now evaluates the total of 8 pieces of DBI information, which have arisen from the DBI0 data line on the basis of conversion circuit 510, in terms of which of the 8 data lines belonging to each of the DBI data lines are to be forwarded, in an inverted or non-inverted form, to memory core 150 to be stored therein. In other words, DBI reversing circuit 530 decides, on the basis of the information derived from data signal DBI0, whether the data signals associated in each case shall be inverted from data lines DQ0, . . . , DQ7 prior to being stored within the framework of memory core 150. The introduction of the DBI information into the data stream to be transmitted, which comes in, at data interface 140, on the part of memory circuit 100, in some embodiments of a memory circuit, or in some embodiments of a memory controller, is conducted in order to limit the energy consumption of the entire memory system. In some embodiments, it may be the case that the internal and/or external data lines are terminated in relation to a positive supply voltage, so that a signal line which carries the value of 0 as a signal may lead to a (quasi) DC current flow on the respective signal line. In order to minimize, in some embodiments, the current caused by this and, thus, the energy consumption caused by this, one embodiment of a controller may, for example, invert the data lines if 4 or at least 5 of the 8 data lines of a byte have a value of 0. Accordingly, even in the case of a data bus wherein the data lines are terminated in relation to a negative supply voltage or a reference potential, a respective inversion may naturally also be introduced in order to reduce excessive current flow in the event of a signal value of 1. Irrespectively thereof, the introduction of DBI reversing circuit 530 thus enables a reduction of the current consumption in the embodiment of a memory circuit 100 which is shown in FIG. 6. In addition, it is also possible to minimize alternating-voltage fractions within the context of respective DBI circuits, so as to implement, for example, as low a number of changes of signals lines as possible. In addition, the 72 data lines output by latch 520 at its output are also forwarded to output buffer 110, via multiplexer 540, as a signal packet comprising 72 bits. Multiplexer 540 here is controlled via the so-called WRTR_flag of global control 170.

Output buffer 110 in turn is a FIFO which includes, in the embodiment shown in FIG. 6, four memory stages each comprising 72 bits per byte, so that output buffer 110 is in a position to store 288 bits per byte. In addition, output buffer 110 exhibits two registers 550, 560 which contain, in the case of register 550, one input pointer each, and which contain, in the case of register 560, one output pointer, which indicates which buffer stage of the four buffer stages of output buffer 110 is to be used with regard to a writing-in or an output of data. Here, in the embodiment depicted in FIG. 6, the two registers 550, 560 may each store (at least) the values of 0, 1, 2, 3. In addition, register 550 has a multiplexer 570 coupled to it which forwards a clock signal to register 570 as a function of signals WRTR_flag and LDFF_flag from global controller 170, it being possible for said clock signal to be based on the signal read_strobe, WRTR_strobe or LDFF_strobe (at burst 7), all of which are located within the framework of the core domain. Here, register 560 is located within the framework of the WCK domain and obtains the clock signal read_strobe or RDTR_strobe from the global control.

Output 130 of output buffer 110 works with the core speed of 500 MHz at a bus width of 72 bits and is coupled to an eight-fold parallel/serial converter 580 (×8 Par2Ser) which, in turn, performs a conversion of the incoming 72 data signals of the core domain into a 9 bits wide data stream in the WCK domain, a transmission speed of 4 Gps being achieved again per pin. Converter 580 is then coupled to data interface 140 via transmit driver circuit 410.

The output of latch 520 is, in addition, also connected to a multiplexer 590 which, as a function of a WRITE/READ signal of global control 170, forwards data which is available at its at least two inputs to EDC circuit 430. In the embodiment depicted in FIG. 6, EDC circuit 430 is configured to calculate a check value, comprising 8 bits, or a check sum, comprising 8 bits, as a CRC8 check sum and to forward same to second output buffer 440 via unidirectional bus 435 which, accordingly, comprises 8 bits. Second output buffer 440, also referred to as EDC FIFO, also comprises four buffer stages for 8 bits each, i.e. 32 bits per byte, in the embodiment shown in FIG. 6. Like output buffer 110, EDC FIFO 440 also comprises two registers 600, 610 which in turn contain, in the case of register 600, an input pointer, and, in the case of register 610, an output pointer, which each identify the buffer stage 0, 1, 2, 3 which is of current interest for writing or reading, respectively. Signals EDC strobe or LDDF_strobe (at burst 7) may be coupled, as clock signals in the core domain, to register 600, again from global control 170, via a multiplexer 620. Accordingly, a READ_strobe or an RDTR_strobe signal may be provided as a clock to register 610 by global control 170, both said signals possibly being delayed by two clock cycles with regard to clock signal CK (control clock), and operating within the WCK domain. The additional time delay of two clock cycles within the CK domain makes allowances for the duration of the calculation of the CRC8 check sum by EDC circuit 430. In the embodiment shown in FIG. 6, an independent output buffer 440 has been implemented for the check sum, or the EDC value, on the basis of this additional calculation duration.

The check sum buffered within second output buffer 440, in turn, is provided at an output of second output buffer 440 (EDC FIFO) with the core speed of 500 MHz at a bus width of 8 bits, and is forwarded to a parallel/serial conversion circuit 630 (Par2Ser) which, in turn, conducts an 8-to-1 conversion to the WCK domain, so that a 4 Gps signal is in turn present at a single signal line at an output of the conversion circuit 630, said single signal line is provided to the further pin 460, or to EDC0 pin 460, via the further transmit driver circuit 450. Thus, multiplexer 590 allows, via EDC circuit 430, in the event that data is written into memory core 150, a verification of the data transmitted to memory circuit 100 in that a CRC8 check value is fed back to the memory controller via EDC circuit 430. This is performed on the basis of the duration of the calculation of the check sum by EDC circuit 430 with a time delay of two clock cycles of the CK clock signal (+2tCK). At a clock frequency of 1 GHz of the CK clock signal, this therefore corresponds to a calculation time, or delay time (EDC delay), of 2 ns.

In the event that data is read from memory core 150, it is initially transmitted as a 64 bits wide data signal of a DBI circuit 640. DBI circuit 640 decides, on the basis of a previously explained strategy for reducing the energy consumption of the bus system in question, whether, and which, respective 8 bits of the data comprising 64 bits from the memory core 150 are to be inverted. DBI circuit 640 then transmits, at an output, the possibly partly inverted 64 bits together with 8 pieces of DBI information in the form of a data bus 500 comprising 72 bits and being coupled, as a unidirectional bus, to multiplexer 540, on the one hand, and to multiplexer 590, on the other hand. In this manner, the data stored within memory core 150 may be made available both to EDC circuit 430 and to output buffer 110.

In addition, the embodiment of a memory circuit 100 depicted in FIG. 6 also comprises a command/address interface 160 coupled, in turn, to address path 480 via a further receive driver circuit 470, address path 480 also being coupled to memory core 150, for example, which is not drawn in to simplify the illustration shown in FIG. 6. Address path 480 is now coupled, on the one hand, to a demultiplexer 650 (DEMUX) via a data bus of a width of 9 bits, said demultiplexer 650 coupling the 9 bits into bus 500 comprising 72 bits as a function of bank address data BA2 to BA0, which is also transmitted via command/address interface, and as a function of the LDFF enable signal provided by the global control.

It is to be noted here that in the embodiment of a memory circuit 100 shown in FIG. 6, temporary memory 490 is implemented, in the form of memory elements, as part of bus 500. In this manner, it is also possible to store the respective 9 bits into the memory elements of bus 500 via demultiplexer 650 as a function of the 3 bits of bank addresses BA2 to BA0. Since eight states may be addressed using the 3 bits of bank addresses BA2 to BA0, each of the 72 data lines of unidirectional bus 500 may be addressed via demultiplexer 650 as a function of the LDFF enable signal so as to couple respective signals into bus 500. Also, address path 480 is coupled to bus 435 via a further demultiplexer 660, it being possible to couple a single bit line of address path 480 into bus 435 comprising 8 bit lines via bank address data BA2 to BA0 as a function of the LDFF enable signal of global control 170. Also in the case of bus 435, individual memory elements are implemented into the data lines, so that bus 435 also comprises temporary memory 490, or the further temporary memory, at the same time. As will be explained below, the individual bit line coupled into bus 435 via demultiplexer 660 may be bank address line BA3, for example. Of course, other signal lines of the command/address bus may also be utilized. The memory elements implemented in bus 435 may quite possibly also be regarded as an independent temporary memory, since they may be implemented such that they are physically separate from the memory elements of bus 500.

With buses 500 and 435, the respective memory elements, or memory cells, are therefore sometimes implemented, in embodiments of a memory circuit 100, to ensure that the individual signal lines of the data bus are present at a defined potential, or in a defined state. By the implementation of the respective memory elements, also referred to as latches, the signal lines of the buses in question are therefore always present in a defined state, either in a low state (L) or in a high state (H). Under normal operating conditions, the respective memory elements prevent a floating, non-defined state, or voltage state, of the individual signal lines.

Prior to discussing, in the context of FIG. 7, temporary-memory mapping of the load FIFO command, wherein address lines of the command/address interface are associated with individual signals (load FIFO address), it may be stated that in one embodiment of a memory circuit 100 as is depicted, for example, in FIG. 6, the output buffer, or READ FIFO 110, is sequentially loaded via a path from an address input 160 of memory circuit 100. For this purpose, in some embodiments of a memory circuit 100, a temporary memory 490 is required which may be realized, for example, from a bidirectional or unidirectional internal data bus of the memory circuit, for example of a DRAM memory circuit. The address data is then sequentially written into the temporary memory in question, which may be effected, for example, in the so-called burst direction. This means that with regard to the embodiment shown in FIG. 6, in eight independent load commands, 10 bits, respectively, are written in parallel into the two output buffers 110, 440, or into the temporary memories in question. Here, 9 bits, respectively, are prepared for output buffer 110, and a further bit is prepared for output buffer 440. Of course, other implementations are possible within the framework of other embodiments. For example, an appropriate write strategy could also be performed in the DQ direction. In this case, all burst positions, respectively, could be written to in parallel for one data line DQ each, within the framework of 10 load commands. Similarly to the embodiment shown in FIG. 6, the temporary memory, or temporary memories, could be addressed, for example, separately via an addressing signal, in FIG. 6 via bank addresses BA2 to BA0, or, additionally or alternatively, via an internal counter within the framework of memory circuit 100. Thus, in the case of a memory circuit 100, for example, appropriate addressing of the temporary memories could be conducted implicitly, for example via global control 170.

If the temporary memory, or memory, is full, or if the bus(es) in question is/are loaded, the entire data packet or data pattern may be written into output buffer 110 or output buffers 110, 440 in parallel. This process may be repeated, in principle, for each FIFO stage. The FIFO load command may implicitly be coupled to a specific address within the temporary memory, for example to the last burst position, which may be, in the case of the embodiment shown in FIG. 6, burst position 7, as will be explained in more detail with reference to FIG. 7. Alternatively or additionally, of course, the address within the temporary memory may also be identified, or defined, explicitly with a load bit within the command in question, or within the context of an address bit.

Since in one embodiment of a memory circuit 100, the possibility of training the DBI parts of data interface 140 (byte interface) is also intended to exist, in one embodiment of a memory circuit 100 as is also shown in FIG. 6, the DBI information cannot be calculated, or cannot be determined, but these may be loaded in parallel via the command/address bus, or the address bus, like the respective data, or DQ data. Likewise, the unidirectional EDC pin 460, which may also be configured as part of the data interface, may be loaded via EDC FIFO 440 in parallel with the DQ data via the address bus.

One possible training sequence which may be implemented within the context of an embodiment of a memory circuit 100, of a memory controller 200, and of a memory system 300, may comprise, for example, two basic steps wherein the data signals may initially be specified, or shifted, within the context of a first substep using a random data pattern or a clock cycle-like data pattern (clock-like pattern) using a clock-data recovery circuit (CDR circuit) or any other appropriate circuit, such that sampling is conducted toward the data center, i.e. in the data eye, respectively, if possible. Here, clock cycle-like data patterns frequently enable very fast specification of the delays in question. In a second substep, the frame in question is then identified, and/or the respective data packets are aligned as a whole. To this end, one may use, for example, data patterns having a random course, de Bruin data patterns, or jagged delta-shaped data patterns (e.g. comprising a single stop bit).

Thus, a training sequence for an interface training using an LDFF command (LOAD FIFO) using embodiments of the present invention may comprise the following steps, for example:

1. Optional command/address interface training, or address training
2. WCK2CK training, wherein the two clock cycle signals CK and WCK are synchronized, or matched, to each other
3. Initialization of the output buffer (FIFO) with a first data pattern, wherein, for example within the framework of 4 initializations which each comprise 8 LDFF commands and transmit 10 bits, data patterns are transmitted, for each buffer stage of output buffer 110, into FIFO 110 and, possibly, into EDC FIFO 440. Here, the output buffer(s) may be filled, for example, entirely with a random clock cycle-like or any other data pattern. As will be explained below, in embodiments of a memory circuit 100, this may be performed, for example, within the context of a comparatively slow implementation of the LDFF command, which may have an advantageous effect in some embodiments of the present invention. For example, the above-mentioned total of (4·8=) 32 LDFF commands may require, in one embodiment, 128 clock cycles with regard to clock CK (128 tCK).
4. Performing a read training, wherein the memory controller, or the GPU, performs, while using the RDTR command, a clock data recovery function (CDR) to achieve a synchronization of the symbols (ui).
5. In a fifth step, which may possibly be dispensed with if it was also possible to perform a frame synchronization within the framework of data pattern 1, the output buffer(s) may be initialized again in a further initializing step of a second data pattern. As was previously explained, the FIFO(s) again may be completely filled with a synchronization data pattern for synchronizing the data frames, also within the context of a total of (4·8=) 32 LDFF commands comprising 10 bits each. These patterns may be de Bruin data patterns, for example, or other data patterns. Depending on the specific configuration of embodiments, a comparatively slow implementation of the LDFF command may again be realized, which for the total of 32 LDFF commands, for example, require 128 clock cycles with regard to the CK clock signal (128 tCK).

6. Performing a read training, wherein, using the RDTT command, the memory controller or GPU in turn performs a clock data recovery functionality so as to conduct a frame synchronization, i.e. a synchronization to the individual bytes.

7. Performing a write training, wherein data is written into the output buffer(s) using a WRTR command, the last N-data bursts being stored within the output buffer, N representing the number of buffer stages of the output buffer(s). Typically, N is larger than or equal to 4. The data patterns written into the output buffer(s) using the WRTR command are subsequently read out again from the output buffer(s) using the RDTR command, so that the memory controller, or the GPU, may again perform a synchronization with regard to the symbols (ui), and a synchronization with regard to the data frames (byte), which terminates the training sequence.

As was previously explained, data may be written into the output buffers (FIFO) via data lines DQ and signal lines DBI. The EDC check sums in question are thereupon calculated and sent back to the memory controller (GPU) once the EDC write latency has elapsed, which may be, for example, 8 clock cycles longer—in relation to clock signal CK—than the write latency WL (WL+8tCK). Here, the EDC check sums remain within EDC FIFO 440. Consequently, a known value is stored both within output buffer 110, or data FIFO 110, and EDC FIFO 440.

With regard to the RDTR command, same transmits, after using the LDFF command, the data stored within the data FIFO, or its content, via data lines DQ0 ... 31, DBI0 to DBI3 (CL·tCK) once the so-called CAS latency CL has expired. In addition, the RDTR command causes transmission of the content of EDC FIFO 440 via EDC pins 460, more specifically via pins EDC0 to EDC3, once a time period, which results as a sum from the CAS latency and the time for calculating the EDC check sum, has elapsed. In one embodiment, it may thus be a time duration, for example, which is two clock cycles longer, relative to clock signal CK, than the CAS latency ((CL+2)·tCK).

In the event of using an RDTR command after a WRTR command, the situation will hardly differ from the above-described situation after utilization of an LDFF command. Here, too, the respective data stored within the two output buffers 110, 440 is also transmitted, after the above-indicated time period has expired, via the same data lines. In this context, one should note that these indications both with regard to the times and to the data lines used are only possible implementations in some embodiments of a memory circuit 100. Basically, other times and other data signals may be used, depending on the specific implementation. In addition, as the previous discussion has also shown, an implementation of the WRTR command and an implementation of the RDTR command may possibly fully be dispenses with.

FIG. 7 schematically shows a representation of the temporary-memory mapping on the basis of a load FIFO command (LDFF) which may lead to a memory via the address lines of the command/address interface within the context of embodiments of a memory circuit 100. For example, as the clock curve 700 shows, in the event of a rising edge of the CK clock signal, the signals transmitted via address lines A0 to A7 into the positions of the temporary memory which are specified for the data signal lines DQ0 to DQ7 of byte 0 may be used for a buffer stage (buffer stage 1) of the two FIFOs. The concerned memory positions within the temporary memory in this context are addressed via the three bank address lines BA2 to BA0, as is indicated at the bottom of FIG. 7. The content of address line A9 is associated to data bit inverting signal DBI0, whereas the information of bank address line BA3 is associated with EDC data line EDC0.

In the embodiment depicted in FIG. 6, on the one hand, the concerned signal line of bus 500 is specified, on the one hand, by the address defined by the three bank address signal lines BA2 to BA0, which at the same time is equivalent to the so-called burst address. In addition, the LDFF command is defined by the three values of address lines A8, A10 and A11, it being possible for the two address lines A8 and A11 in this case to comprise, for example, the potential of high (H) and for address line A10 to comprise the potential of low (L). In this manner, the LDFF command may be effected, via the address lines of the command/address interface, as a subcommand, for example of the write command (WRITE) by fixing or setting the above-mentioned address line value (e.g. A8).

In this manner, by varying the bank address line values (BA2 to BA0), a value may be written into the temporary memory at each burst address via the appropriate signal line values. To this end, 8 LDFF commands, which may be effected, for example, in the order indicated by arrow 710, are necessary for addressing the total of 8 different burst address values (0, ... , 7). If this order is strictly adhered to, for example, or if at least burst address 7 is sent last, global control 170 may be instructed, for example, by using bank address signal line values BA2=BA1=BA0=1, which corresponds to burst address 7, to output a LDFF_FIFO load pulse which may lead to a transmission of the values stored within the temporary memory to the two output buffers 110, 440.

In addition, in the right-hand part FIG. 7 shows that parallel thereto, it is not only possible to load byte 0 with the LDFF command, but that the other three bytes, more specifically bytes 1 to 3, may also be transmitted in parallel in accordance with the values shown in the right-hand part in FIG. 7. Depending on the specific configuration of an embodiment, it is quite possible that an individual programming of the individual bytes may be advantageous if, for example, a cross talk occurs between the first lines of the individual bytes.

As was already previously indicated, an embodiment of a memory circuit 100, of a memory controller 200, and of a memory system 300 may naturally be also configured such that the data lines (DQ, DBI, EDC) are not stored in parallel, but that rather the burst positions, or burst addressed, are written. This would mean that rather than filling the columns of table 720 in FIG. 7 with an LDFF command, the individual rows of table 720 would be filled.

With regard to the possible implementation of the LDFF command which is described with regard to FIG. 7, FIG. 8 depicts a table which, in column 750, shows a list of the address lines of the command/address interface, which contains the values indicted in columns 760-0 to 760-3, for signal lines DQ0 to DQ31, DBI0 to DBI3, EDC0 to EDC3 of the total of four bytes 0 to 3.

In the implementation explained with reference to FIGS. 7 and 8, the LDFF command thus represents a subcommand of the WRTR command, wherein the address line A8 is set to the value of high (A8=H) to differentiate the subcommand. Here, 10 bits of the address pins, or address lines, of the command/address interface are sampled and are stored into the output buffer, or READ FIFO 110, and EDC FIFO 440, possibly by using the internal data buses. More specifically, the values for data lines DQ0 to DQ7, DBI0 and data line EDC0 are transmitted here. The value for the data line of the further pin 460 (EDC0) is loaded into EDC FIFO 440. As was already shown by the technical discussion of the embodiment depicted in FIG. 6, it may be advisable in this case to design EDC FIFO 440 with the same depth, and/or the same number of buffer stages exhibited also by the output buffer, or data FIFO, 110. Depending on the specific implementation, this may be, for example, a minimum depth or number of buffer stages of 4.

The above-mentioned data lines here only refer to the 0 byte. The other bytes 1 to 3 here are loaded in parallel with the same data pattern via the address of the command/address interface 160. In other words, bytes 0 to 3 are thus loaded in parallel with the same "address pattern". The burst position, or address position, may be selected via bank address lines BA2 to BA0. As was already explained with reference to FIG. 7, in some embodiments every LDFF command which corresponds to a burst address 7 (BA2=1; BA1=1; BA0=1) leads to an increase in the pointer address of the output buffer(s) in question. This results in that the data is present in such a state as if this data were read from memory core 150 within the context of an ordinary read command (read). Depending on the specific implementation, it may also be required or optionally desired that in some embodiments an LDFF command will lead to an allowed state only if no read command (read) or write command (write) is performed.

Also depending on the given implementation, it may be advisable for various embodiments to implement LDFF commands with a lower speed, so that, for example, a distance between two successive LDFF commands may be limited to at least four clock cycles in relation to the clock signal CK (4·tCK). This may be implemented, for example on the part of an embodiment of a memory controller 200, in that a command chain

LDFF-NOP-NOP-NOP-(LDFF . . . )

is implemented, NOP standing for a no-operation command.

Even though an LDFF command can, in principle, have a length of only one clock cycle in relation to clock signal CK (1·tCK), it may be quite advantageous in some embodiments to implement the LDFF command more slowly. In this way, it may be possible, for example, in one embodiment, to realize an implementation of the LDFF command without having to sacrifice a (significant) amount of additional chip surface for the implementation in question. Depending on the specific embodiment, it is possible for the configuration of an LDFF command to require, for example, four clock cycles in relation to clock signal CK (4·tCK), which to an internal frequency of 250 MHz, as a ¼·tCK.

Depending on the specific embodiment, complete filling of the output buffer(s) (FIFO) with 4 entries in 4 buffer stages (4·8=) 32 LDFF commands, respectively, may require an overall time period of 128 clock cycles in relation to clock signal CK (128.tCK). In many implementations and application scenarios such an implementation may be quite advantageous, since thus a more favorable implementation is possible because of the lower speed and the lower signal speed, as with typical employment scenarios the LDFF command is frequently not used. Depending on the specific implementation of an embodiment, the LDFF command may thus be employed relatively rarely if, for example, a cyclic recalibration of the data interface in question should be necessary, or if a change of frequency is to be performed, or has been performed, for example to save energy.

Embodiments of the present invention thus enable, for example, an initialization of the FIFO(s) for a read training in the case of a GDDR5 DRAM memory circuit via the address bus, or the command/address interface. In addition, embodiments may naturally be just as well employed within the field of graphics memories, graphics DRAM modules or in other high-speed memories or other memories, as the above discussion of the possible memory technologies and areas of application has shown. For example, in particular, embodiments of the present invention are not limited to GDDR5 memory circuits or other graphics memories, but may in principle be used in any memory circuits, memory controllers and memory systems which may be employed in computer systems.

Some embodiments of a memory circuit enable the utilization of data masks which may be loaded via the command/address interface, possibly after training of the address lines has been performed, into an output buffer or READ FIFO for training the interface. This may be performed, for example, within the context of encoding subcommands (WRTR, RDTR, WRDM, WRSM, LDFF). Depending on the specific configuration of some embodiments, an LDFF command may utilize, for example, the address values of the command/address interface for initializing the FIFO(s). Thus, some embodiments of a memory circuit 100, a memory controller 200, and a memory system 300 allow a pre-initialization of an output buffer or of several output buffers in the context, for example using an RDTR command for calibration or re-calibration within the context of a read training. In particular, user-defined data patterns may be transferred to the data FIFO by the command/address interface, or the address path, so that in principle, a multitude of possible scenarios are covered which may comprise, for example, inter-symbol interference scenarios (ISI) and cross-talk scenarios (X-talk).

Depending on the circumstances, embodiments of a means for generating a transmit data pattern within the memory controller may count a signal generator with a random, pre-defined or calculated signal form which may be implemented, for example, in a digital or analog manner. A means for transmitting the transmit data pattern may comprise, for example, a driver circuit, a conversion circuit, an amplifier circuit or any other signal-influencing circuit. A means for transmitting the transmit data pattern may include, for example, a terminal PIN, a socket, a plug-in connection, a solder connection, a signal line or any other electrically conductive connection. A means for receiving the transmit data pattern may include, for example, a receive driver circuit, an amplifier circuit, a latch circuit, a transmission circuit or any other signal-influencing circuit. A means for forwarding the transmit data pattern may comprise, for example, a unidirectional bus structure, a bidirectional bus structure or any other electrically conductive structure for transmitting data. A means for buffering the forwarded transmit data pattern may comprise, for example, a buffer memory, a latch memory, a signal memory, a FIFO memory, a stack memory, or any other memory. A means for outputting the buffered transmit data pattern may comprise, for example, an amplifier circuit, a transmit driver circuit, an amplifier circuit or any other signal-influencing circuit. A means for transmitting the transmit data pattern which is output may comprise the same technical implementations as the means for transmitting the transmit data pattern which was illustrated above. A means for receiving the transmit data pattern as the receive data pattern may comprise the same technical implementations as the means for receiving the transmit data pattern, as was already discussed above. A means for synchronizing the data interface may comprise, for example, a clock data recovery circuit, a PLL circuit, a comparator circuit, a phase detector circuit, a delay circuit, a comparator, a comparator circuit, or any other synchronization circuit.

Depending on the circumstances, embodiments of methods such as are implemented, for example, in the embodiments of the memory controller or of the memory circuit 100, may be implemented in hardware or in software. The implementation may be effected, for example, on a digital storage medium, in particular a disk, CD, DVD or any other storage medium with electronically readable control signals which may cooperate with a programmable processor in such a manner that embodiments of the methods are performed.

Generally, embodiments of the present invention thus also consist in a software program product, or a computer program product, or a program product comprising a program, stored on a machine-readable carrier, for performing an embodiment of an inventive method, when the software program product runs on a processor or on a computer. In other words, an embodiment of the invention may thus be realized as a computer program, or as a software program, or a program comprising a program code for performing an embodiment of the method, when the program runs on a processor. The processor may be formed by a computer, a chip card (smart card), an ASIC (application-specific integrated circuit), an integrated circuit, a game console, a mobile computer system (e.g. PDA=portable data assistant), a graphics board for a computer system, or any other integrated circuit.

The invention claimed is:

1. A controller comprising:
a command/address interface having a command portion and an address portion, the address portion separate from the command portion;
a data interface for transmitting and receiving data; and
a synchronization circuit coupled to the command/address interface and to the data interface, and adapted to output a transmit data pattern on the address portion of the command/address interface, further adapted to receive a receive data pattern from the data interface, the receive data pattern comprising a buffered and retransmitted version of the transmit data pattern, and further adapted to perform a training operation on the data interface on the basis of the transmit data pattern and the receive data pattern, the transmit data pattern selected to perform one of a symbol training operation and a frame synchronization operation.

2. The controller as claimed in claim 1, wherein the synchronization circuit comprises a phase detector adapted to determine a phase position of the receive data pattern.

3. The controller as claimed in claim 2, further comprising a delay circuit coupled to the data interface and adapted to cause the synchronization of the data interface on the basis of the phase position of the receive data pattern.

4. The controller as claimed in claim 3, wherein the data interface comprises a plurality of data lines, each data line of the plurality of data lines comprising a delay circuit adapted to cause the synchronization of the data lines of the data interface on the basis of the phase position of the receive data pattern.

5. The controller as claimed in claim 4, wherein the phase detector is adapted to determine correction information or correction signals which are provided to the delay circuit.

6. The controller as claimed in claim 2, wherein the phase detector is adapted to decide, on the basis of a comparison of the transmit data pattern and the receive data pattern, whether the receive data pattern should be subject to an additional delay, a minor delay, or an unchanged delay, with regard to the transmit data pattern.

7. The controller as claimed in claim 2, wherein the phase detector is adapted to compare the receive data as modified by a delay circuit so that the receive data is synchronized by suitable delays so that the receive data matches the transmit data pattern.

8. The controller as claimed in claim 1, wherein the synchronization circuit is adapted to generate a pre-determined data pattern as the transmit data pattern.

9. The controller as claimed in claim 1, wherein the controller is a GPU.

10. The controller as claimed in claim 1, wherein the controller is a DRAM memory controller.

11. The controller as claimed in claim 1, wherein the synchronization circuit is adapted to assert a write training WRTR command and a read training RDTR command to a controlled circuit, the read training RDTR command and the write training WRTR command performing one of a symbol training operation and a frame synchronization operation between the controller and the controlled circuit.

12. The controller as claimed in claim 1, wherein the transmit data pattern is output only on the address portion of the command/address interface of the memory controller.

13. A method of synchronizing a memory system comprising a memory controller and a memory circuit, the memory controller having a command/address interface and a data interface, the command/address interface of the memory controlling having a command portion and an address portion, the address portion separate from the command portion, the memory circuit having a command/address interface coupled to the command/address interface of the memory controller and a data interface coupled to the data interface of the memory controller, the data interface of the memory controller and the data interface of the memory circuit adapted so that data passes bi-directionally between the memory controller and the memory circuit, the method comprising:
generating a transmit data pattern at the memory controller, the transmit data pattern selected to perform one of a symbol training operation and a frame synchronization operation;
outputting the transmit data pattern via the address portion of the command/address interface of the memory controller, which is coupled to an address portion of the command/address interface of the memory circuit;
receiving the transmit data pattern at the address portion of the command/address interface of the memory circuit;
forwarding the transmit data pattern to an output buffer of the memory circuit;
outputting the transmit data pattern from the output buffer of the memory circuit to the data interface of the memory circuit;
transmitting the transmit data pattern as a receive data pattern to the data interface of the memory controller;
receiving the receive data pattern at the data interface of the memory controller; and
training the data interface on the basis of the transmit data pattern and the receive data pattern.

14. The method of synchronizing a memory system as claimed in claim 13, wherein transmitting the transmit data pattern comprises transmitting a first part of the transmit data pattern and transmitting a second part of a transmit data pattern, transmitting the transmit data pattern from the memory controller to the memory circuit comprises transmitting the first part of the transmit data pattern and transmitting the second part of the transmit data pattern, receiving the transmit data pattern at the command/address interface of the memory circuit comprises receiving the first part of the transmit data pattern and receiving the second part of the transmit data pattern, and forwarding the transmit data pattern comprises temporarily storing the first part of the transmit data pattern and forwarding the temporarily stored first part of the transmit data pattern along with the second part of the transmit data pattern to the output buffer of the memory circuit.

15. The method of synchronizing a memory system as claimed in claim 13, wherein the step of outputting the transmit data pattern via an address portion of the command/address interface of the memory controller comprises outputting the transmit data pattern only via the address portion of the command/address interface of the memory controller.

16. A device for synchronizing a memory system comprising a memory controller and a memory circuit, the memory controller having a command/address interface and a data interface, the command/address interface of the memory controlling having a command portion and an address portion, the address portion separate from the command portion, the memory circuit having a command/address interface coupled to the command/address interface of the memory controller and a data interface coupled to the data interface of the memory controller, the data interface of the memory controller and the data interface of the memory circuit adapted so that data passes bi-directionally between the memory controller and the memory circuit, the device comprising:

a generator for generating a transmit data pattern in the memory controller, the transmit data pattern selected to perform one of a symbol training operation and a frame synchronization operation;

a first transmitter for transmitting the transmit data pattern to the address portion of the command/address interface of the memory controller;

a second transmitter for transmitting the transmit data pattern from the address portion of the command/address interface of the memory controller to an address portion of the command/address interface of the memory circuit;

a first receiver for receiving the transmit data pattern from the address portion of the command/address interface of the memory circuit;

a forwarder for forwarding the transmit data pattern;

a buffer for receiving and buffering the forwarded transmit data pattern;

an outputter for outputting the buffered transmit data pattern to a data interface of the memory circuit;

a third transmitter for transmitting the output transmit data pattern to the data interface of the memory controller;

a second receiver for receiving the transmit data pattern as the receive data pattern from the data interface of the memory controller; and a circuit for training the data interface of the memory controller on the basis of the transmit data pattern and the receive data pattern.

17. The device of claim 16, wherein the first transmitter transmits the transmit data only on the address portion of the command/address interface of the memory controller.

* * * * *